United States Patent
Ishii et al.

(10) Patent No.: US 7,259,830 B2
(45) Date of Patent: Aug. 21, 2007

(54) IMAGE EXPOSURE DEVICE

(75) Inventors: Shuichi Ishii, Kanagawa-ken (JP); Hiromi Ishikawa, Kanagawa-ken (JP); Yoji Okazaki, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 51 days.

(21) Appl. No.: 11/090,856

(22) Filed: Mar. 28, 2005

(65) Prior Publication Data
US 2005/0213068 A1   Sep. 29, 2005

(30) Foreign Application Priority Data
Mar. 26, 2004 (JP) .............................. 2004-092685
Jan. 14, 2005 (JP) .............................. 2005-007197

(51) Int. Cl.
G03B 27/54 (2006.01)
G03B 27/42 (2006.01)

(52) U.S. Cl. .......................................... 355/67; 355/53

(58) Field of Classification Search ................ 355/52, 355/53, 55, 67–71; 356/399–401; 250/548
See application file for complete search history.

(56) References Cited

U.S. PATENT DOCUMENTS 4,939,630 A * 7/1990 Kikuchi et al. ............. 362/268
5,619,304 A * 4/1997 Yasuzato ..................... 355/71
5,724,122 A * 3/1998 Oskotsky ..................... 355/67
6,876,494 B2 * 4/2005 Ishikawa et al. ............ 359/618
2003/0214571 A1   11/2003 Ishikawa et al.

OTHER PUBLICATIONS

A. Ishikawa, "Shortening of Development and Application of Mass Production by Maskless Exposure", Electronics Mounting Technology, 2002, pp. 74-79, vol. 18, No. 6.

* cited by examiner

*Primary Examiner*—Henry Hung Nguyen
(74) *Attorney, Agent, or Firm*—Sughrue Mion, PLLC

(57) ABSTRACT

An image exposure device includes an exposure head for forming a desired pattern on a photosensitive material. The exposure head is equipped with a light source for emitting a great number of light beams, a spatial light modulator in which a great number of pixel portions are arranged for independently modulating the light beams emitted from the light source, a micro lens array in which a great number of micro lenses are arranged for individually converging the great number of light beams modulated by the pixel portions, and a total of two or more aperture arrays arranged in the stage before the micro lens array and/or the stage after the micro lens array. Each of the aperture arrays has a great number of apertures for individually restricting the light beams.

20 Claims, 18 Drawing Sheets

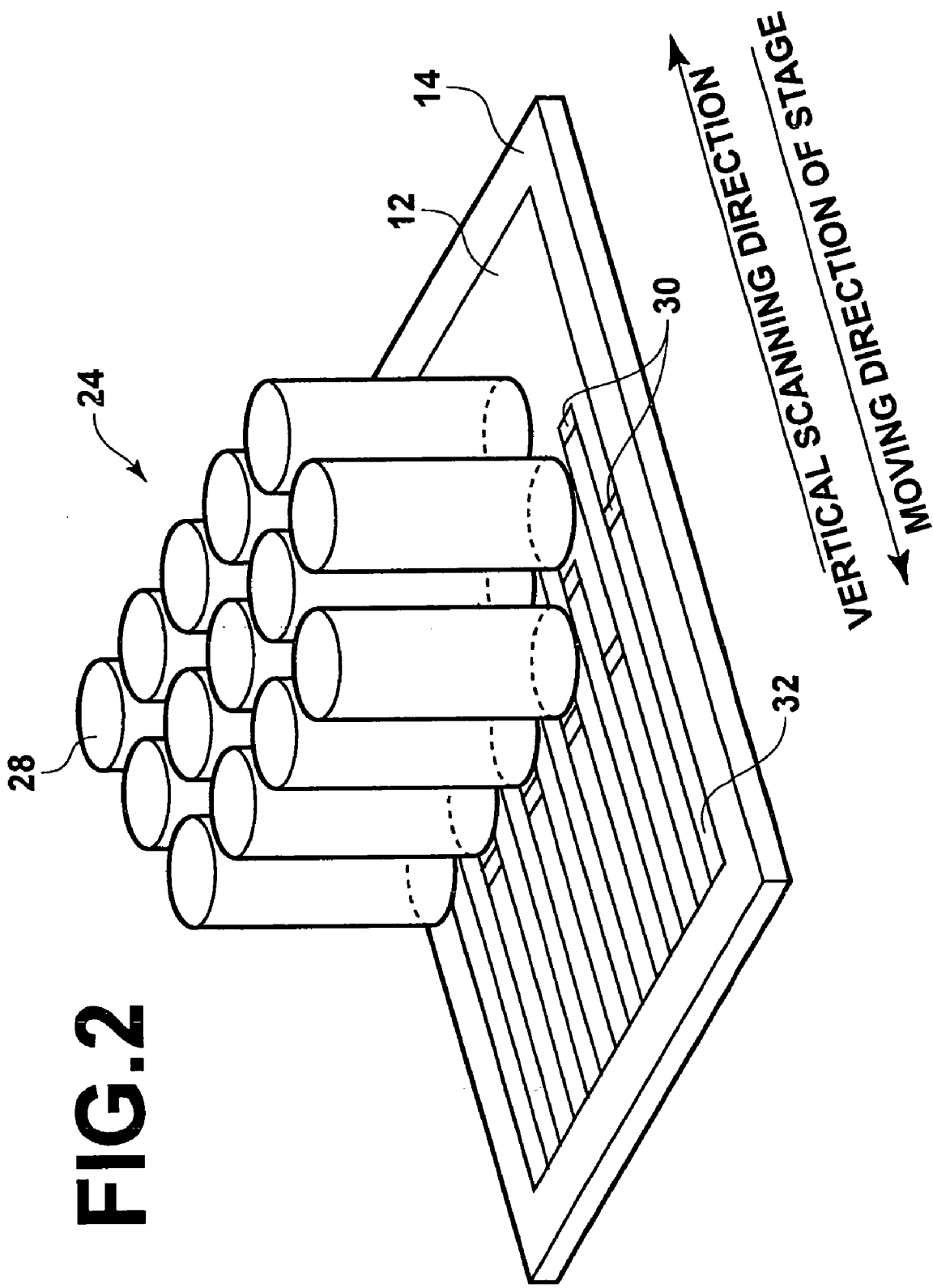

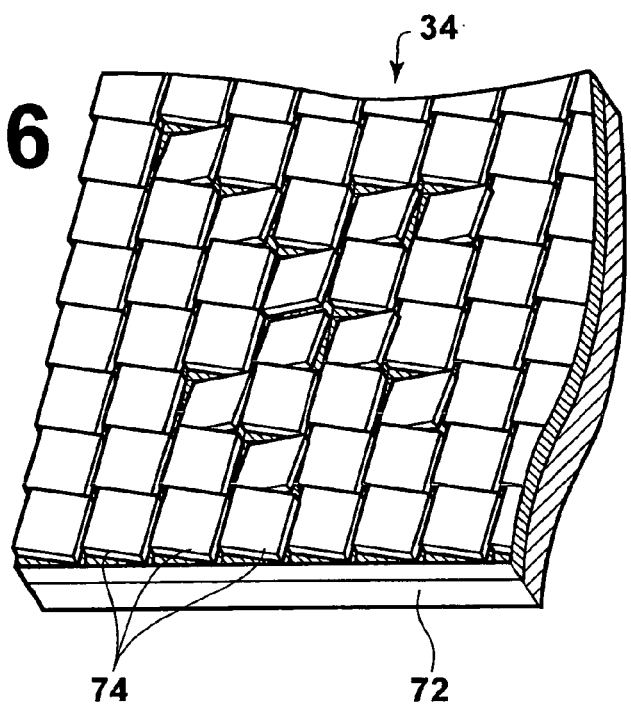
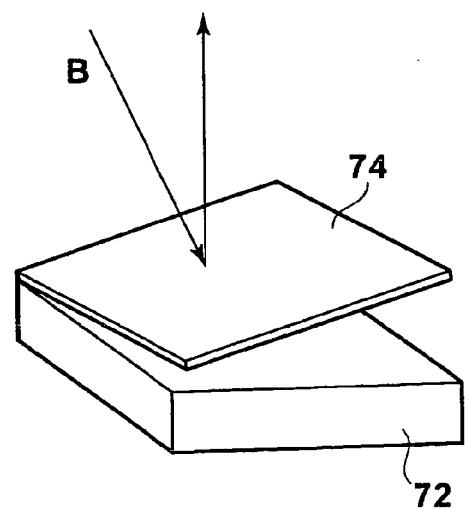
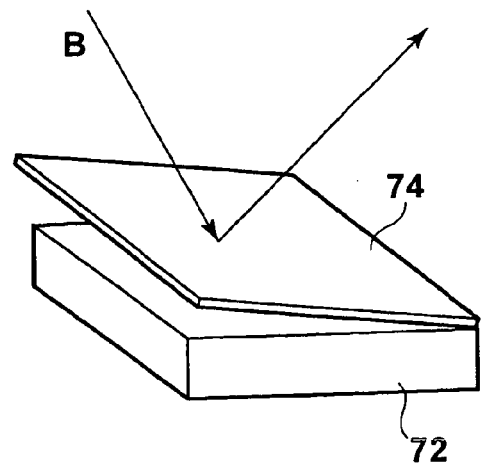

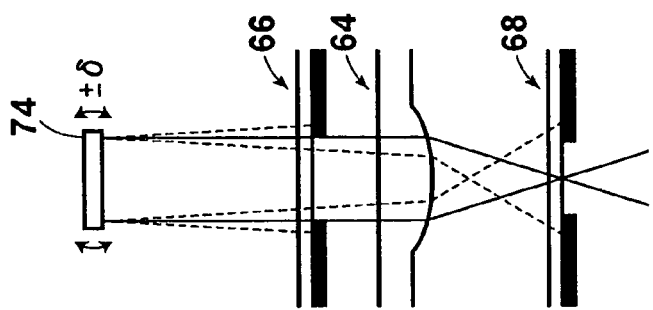
FIG. 18D EMBODIMENT
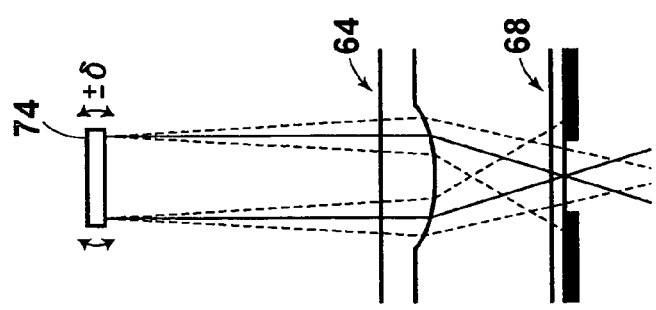
FIG. 18C COMPARATIVE EXAMPLE
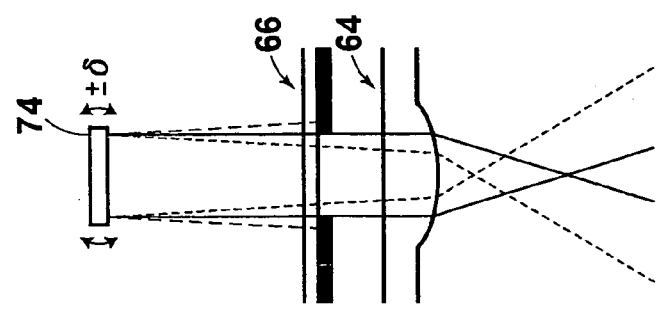
FIG. 18B COMPARATIVE EXAMPLE
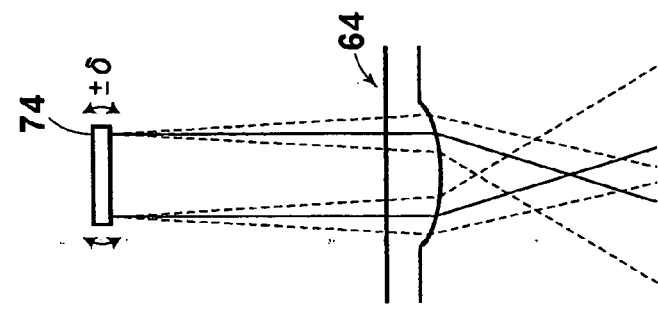
FIG. 18A COMPARATIVE EXAMPLE

IMAGE EXPOSURE DEVICE

BACKGROUND OF THE INVENTION

1. Field of the Invention

The present invention relates to image exposure devices, and more particularly to image exposure devices equipped with an exposure head for forming a desired pattern on a photosensitive material.

2. Description of the Related Art

There are known image exposure devices with an exposure head for forming a desired pattern on a photosensitive material. This kind of exposure head basically comprises a light source; a spatial light modulator in which a great number of pixel portions are arranged for independently modulating light beams emitted form the light source according to a control signal; and an imaging optics system for forming an image of the light modulated by the spatial light modulator on the photosensitive material. The fundamental construction is described, for example, in A. Ishikawa, "Shortening of Development and Application of Mass Production by Maskless Exposure," Electronics Mounting Technology, Technology Investigation Board Inc., Vol 18, No. 6, 2002, pp. 74-79.

U.S. Patent Application Publication No. 20030214571 discloses another exposure head, which comprises a light source; a digital micro mirror device (hereinafter referred to as a DMD) as a spatial light modulator equipped with a great number of micro mirrors; and a micro lens array in which a great number of micro lenses are arranged for individually converging the light beams modulated by the micro mirrors. In such a construction employing a micro lens array, even if an image exposed on a photosensitive material is enlarged, the light beams from the pixel portions of the spatial light modulator are converged by the micro lenses of the micro lens array. Therefore, the size of a pixel (spot size of each light beam) of an exposed image on the photosensitive material is kept small and the sharpness of the image can be kept high. Note that the DMD employed as a spatial light modulator in the aforementioned construction is a mirror device in which a great number of micro mirrors with a reflecting surface whose angle is independently varied according to a control signal are arranged on a semiconductor substrate such as silicon, etc. The exposure head shown in the aforementioned Publication No. 20030214571 further includes a single aperture array arranged in the stage after the micro lens array. The aperture array has a great number of apertures for individually restricting the aforementioned light beams. With operation of the aperture array, each light beam is shaped so that the size of a pixel becomes a fixed size on the photosensitive material, and crosstalk between adjacent pixels can be prevented.

However, in image exposure devices using a spatial light modulator such as a DMD, when turning each pixel portion of the spatial light modulator ON/OFF, the problem of chattering will arise. That is, it takes a slight time for the ON state or OFF state of the pixel portion to become stable. Since chattering causes the optical path of a light beam modulated by each pixel portion to fluctuate and the position of an exposed point to change on the photosensitive material, the sharpness of an exposed image will be reduced. An adverse influence due to chattering becomes more serious as switching of the ON and OFF states of the pixel portion is enhanced for high-speed exposure.

Also, if stray light that originates in a spatial light modulator, or marginal light is produced and reaches a photosensitive material, it can be another cause of the sharpness of an exposed image being reduced in image exposure devices. As described in the aforementioned Publication No. 20030214571, if a single aperture array is arranged in the stage after the micro lens array, it is possible to remove the stray light and assure a high total extinction ratio (ratio of the light quantity obtained by all pixels in the ON state and the light quantity obtained by all pixels in the OFF state). However, if stray light is to be removed by only a single aperture array arranged in the stage after the micro lens array, the size of each aperture and the position of the aperture array must be very strictly determined according to the diameter of the imaging components of each light beam collected by the micro lens array, and consequently, alignment of the aperture array and other components becomes extremely difficult.

SUMMARY OF THE INVENTION

The present invention has been made in view of the circumstances described above. Accordingly, it is an object of the present invention to provide an image exposure device that is capable of lessening a reduction in the sharpness of an exposed image due to chattering of a spatial light modulator and stray light. Another object of the invention is to provide an image exposure device which is capable of realizing a high total extinction ratio and ease of alignment.

An image exposure device of the present invention includes an exposure head for forming a desired pattern on a photosensitive material. The exposure head comprises four major components: (1) a light source for emitting a great number of light beams; (2) a spatial light modulator in which a great number of pixel portions, for independently modulating the light beams emitted from the light source, are arranged; (3) a micro lens array in which a great number of micro lenses, for individually converging the light beams modulated by the pixel portions, are arranged; and (4) a total of two or more aperture arrays arranged in the stage before the micro lens array and/or the stage after the micro lens array. Each of the aperture arrays has a great number of apertures for individually restricting the light beams.

In the image exposure device of the present invention, at least one of the aperture arrays is preferably arranged in the stage before the micro lens array, and at least one of the aperture arrays is preferably arranged in the stage after the micro lens array.

In the image exposure device of the present invention, at least one of the aperture arrays may be stuck on a lens surface of the micro lens.

In the image exposure device of the present invention, the aforementioned exposure head may further comprise an imaging lens for forming respective images of the pixel portions of the spatial light modulator on the lens surfaces of the micro leans array.

In the image exposure device of the present invention, the aforementioned exposure head may further comprise an optical system, arranged between the spatial light modulator and one of the aperture arrays arranged closet to the spatial light modulator, for making the light beams parallel. This optical system may have the function of scaling up and scaling down images.

In the image exposure device of the present invention, all of the aforementioned aperture arrays may be arranged away from the micro lens array.

In the image exposure device of the present invention, the aforementioned spatial light modulator may comprise a digital micro mirror device that has a great number of micro mirrors for reflecting light emitted from the light source, as the pixel portions.

In the image exposure device of the present invention, the aforementioned exposure head may comprise a plurality of exposure heads.

In the image exposure device of the present invention, even if the optical path of each light beam fluctuates due to chattering of the spatial light modulator, the marginal portion of each light beam that undergoes the influence of the fluctuation can be shut off by a total of two or more aperture arrays. Therefore, fluctuations in the position of an exposed point can be reduced and a high-definition image can be obtained.

The aperture array can be constructed by attaching to a transparent support member of quartz glass a light-intercepting film of chromium having a thickness that assures sufficient light interception, and forming apertures in the light-intercepting film. If two or more aperture arrays are used instead of a single aperture array, the light-intercepting film per each aperture array can be made thinner. Therefore, the strain of each aperture array due to the absorption of heat by the constituent material of the light-intercepting film can be prevented.

In the case where a total of two or more aperture arrays are arranged in the stage before the micro lens array and/or in the stage after the micro lens array, stray light can be removed by the first aperture array and therefore the size of each aperture in the second aperture array 68 does not need to make smaller for the purpose of removing stray light. The size of each aperture in the second aperture array will do if it can shut off the marginal light component due to scattering, irregular reflection, and multiple reflection and can ensure a sufficient total extinction ratio. Therefore, alignment of the aperture arrays and other components can be easily performed while realizing removal of stray light and assurance of a high total extinction ratio.

If at least one of the aperture arrays is stuck on a lens surface of the micro lens, the positional relationship between the position of each aperture of the aperture array and the lens surface of the micro lens can be more accurately determined so that a temporal change will not occur. Therefore, an image of higher definition can be formed on the photosensitive material.

If the exposure head of the image exposure device of the present invention further includes an imaging lens for forming respective images of the pixel portions of the spatial light modulator on the lens surfaces of the micro leans array, the light beams modulated by the pixel portions can be more accurately converged on the photosensitive material, and an image of higher definition can be formed on the photosensitive material.

In the case where the aforementioned exposure head further includes an optical system, arranged between the spatial light modulator and one of the aperture arrays arranged closet to the spatial light modulator, for making the light beams parallel, the adjustment of the size of each aperture and position of the aperture array for removing stray light becomes easy in the aperture array arranged closet to the spatial light modulator.

In the case where all of the aperture arrays are arranged away from the micro lens array, even if the constituent member of each aperture array absorbs heat, the heat is hardly transmitted to the micro lens array and there is no possibility that the heat will have an adverse influence on the optical performances of the micro lens array.

When a DMD with a greater number of micro mirrors is employed as the spatial light modulator, advantages of the DMD, such as a reduction in device size, weight saving, high contrast, etc., can be obtained. On the other hand, because of the strain of the marginal portion of each micro mirror, components that can cause stray light will occur, but since these components can be removed by the aperture arrays, there is no possibility that the sharpness of an exposed image will be reduced.

If a plurality of exposure heads are employed, exposure efficiency can be enhanced.

BRIEF DESCRIPTION OF THE DRAWINGS

The present invention will be described in further detail with reference to the accompanying drawings wherein:

FIG. 2 is a perspective view showing the scanner of the image exposure device of FIG. 1;

FIG. 6 is a part-enlarged view of the digital micro mirror device (DMD) of the image exposure device shown in FIG. 1;

FIG. 7, which includes FIGS. 7A and 7B, is an explanatory diagram used to explain operation of the DMD;

FIGS. 15A to 15D, is an explanatory diagram used to explain the comparison of three comparative examples and an embodiment of the present invention with regard to removal of stray light and assurance of a high total extinction ratio;

FIG. 18, which includes FIGS. 18A to 18D, is an explanatory diagram used to explain the comparison of three comparative examples and an embodiment of the present invention with regard to fluctuations in the position of an exposed point due to chattering;

DESCRIPTION OF THE PREFERRED EMBODIMENTS

Figure 1:
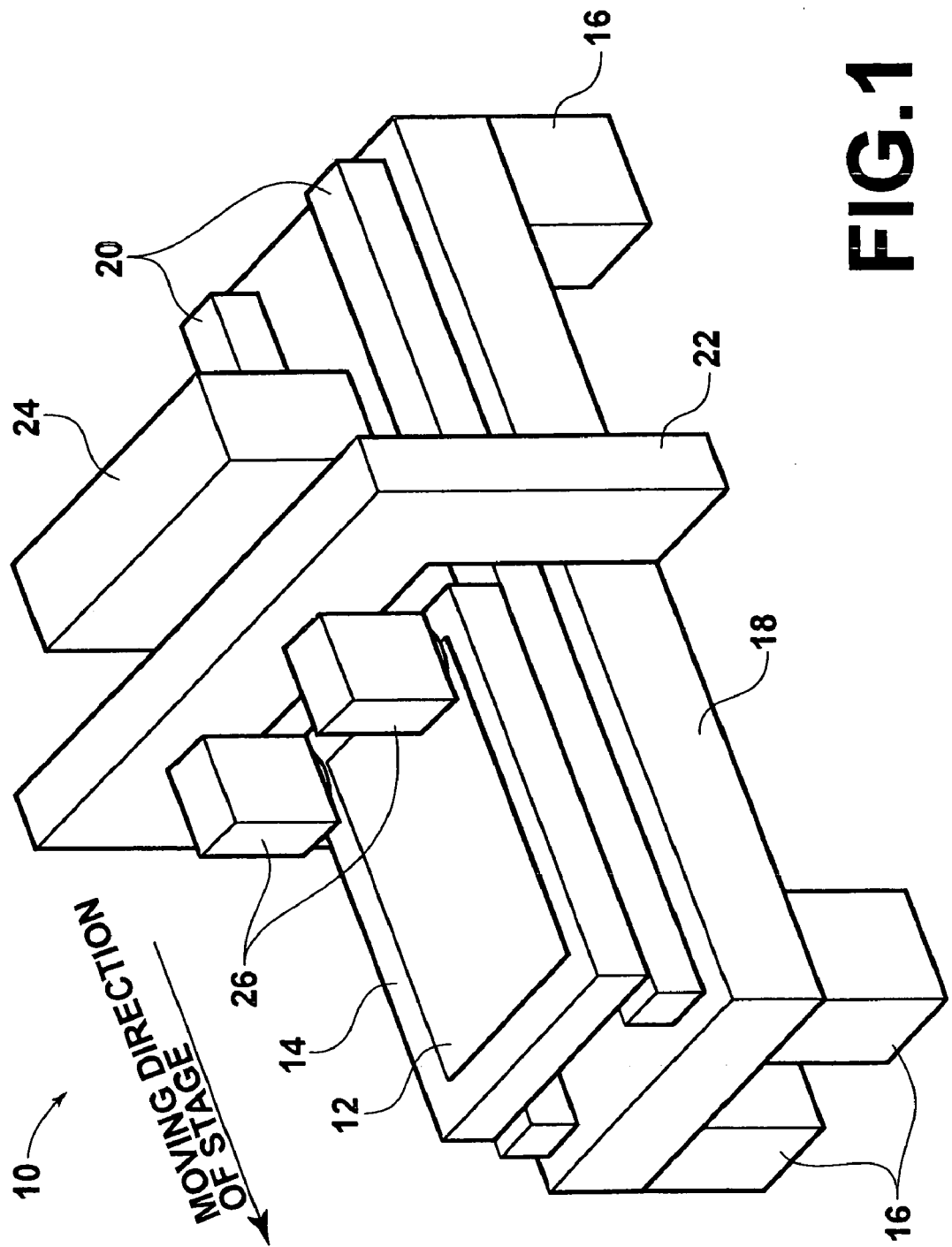
FIG. 1 is a perspective view showing an image exposure device constructed in accordance with a preferred embodiment of the present invention.

Referring initially to FIG. 1, there is shown an image exposure device 10 constructed in accordance with a preferred embodiment of the present invention. The image exposure device 10 is equipped with a movable stage 14 that attracts and holds a sheet-shaped photosensitive material 12 on the surface thereof, as shown in the figure. A mounting bed 18 is supported by four bed supporting posts 16 and has two guides 20 mounted thereon. The two guides 20 extend along the moving direction of the movable stage 14. The movable stage 14 has a longitudinal direction parallel to the moving direction of the movable stage 14 and is supported by the guides 20 so it can reciprocate. Note that the image exposure device 10 is provided with a stage driver 116 (see FIG. 20) for driving the movable stage 14 (vertical scanning means) along the guides 20.

An inverted U shaped gate 22 is provided on the longitudinally central portion of the mounting bed 18 and stands straddling the moving path of the movable stage 14. The lower end portions of the inverted U shaped gate 22 are secured to both side surfaces of the mounting bed 18. A scanner 24 is disposed on one side of the gate 22. A plurality of sensors 26 (e.g., two sensors in this embodiment) are disposed on the other side of the gate 22 to detect the front end and rear end of the photosensitive material 12. The scanner 24 and sensors 26 are attached to the gate 22 so they are positioned above the moving path of the movable stage 14. Note that the scanner 24 and sensors 26 are connected to a controller (not shown) by which they are controlled.

Figure 3A:
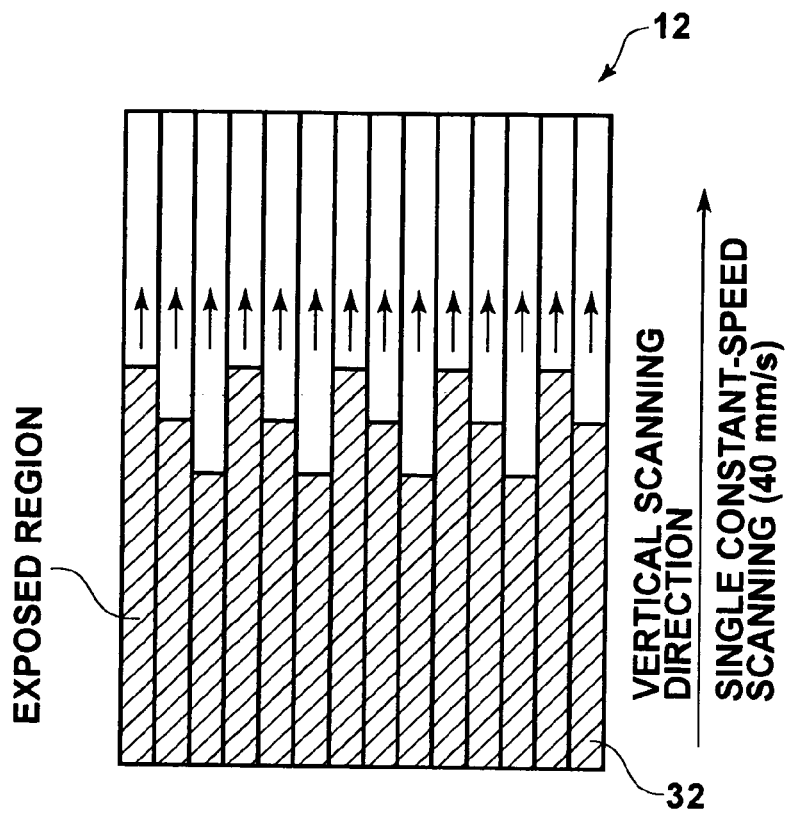
FIG. 3A is a plan view showing exposed regions formed on a photosensitive material.
Figure 3B:
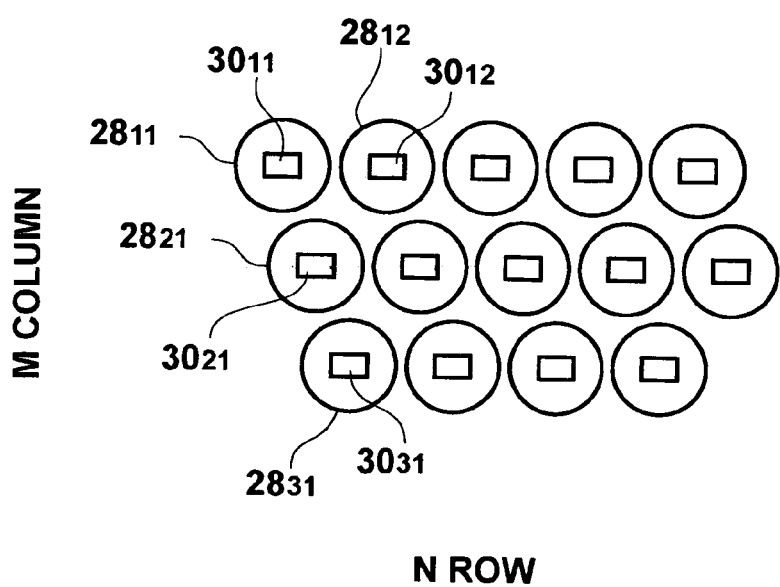
FIG. 3B is a plan view showing the arrangement of the exposure areas of the exposure heads.

The scanner 24 is equipped with a plurality of exposure heads 28 (e.g., fourteen exposure head 28 in this embodiment) arrayed in the form of approximately a matrix of m rows and n columns (e.g., 3 rows and 5 columns), as shown in FIGS. 2 and 3B. In this example, the third row has only four exposure heads 28 in connection with the width of the photosensitive material 12. The exposure head arranged in the $n^{th}$ column of the $m^{th}$ row is referred to as the exposure head $28_{mn}$.

An exposure area 30 by the exposure head 28 is rectangular in shape and the short side of the rectangular exposure area 30 is arranged parallel to the vertical scanning direction. Therefore, as the movable stage 14 is moved, a ribbon-like exposed region 30 is formed on the photosensitive material 12 by each exposure head 28. The exposure area by the exposure head $28_{mn}$ arranged in the $n^{th}$ column of the $m^{th}$ row is referred to as the exposure area $30_{mn}$.

As shown in FIGS. 3A and 3B, the exposure heads 28 arranged in each of the rows are shifted a predetermined space in the row direction from the exposure heads 28 in the next row so that ribbon-like exposed regions 32 are arranged without a space in a direction perpendicular to the vertical scanning direction. The predetermined space is natural number times the long side of the rectangular exposure area 32 and, in this embodiment, is twice the long side of the rectangular exposure area 32. Therefore, the region between the exposure area $30_{11}$ and exposure area $30_{12}$ in the first row which cannot be exposed can be exposed by the exposure area $30_{21}$ in the second row and the exposure area $30_{31}$ in the third row.

Figure 4:
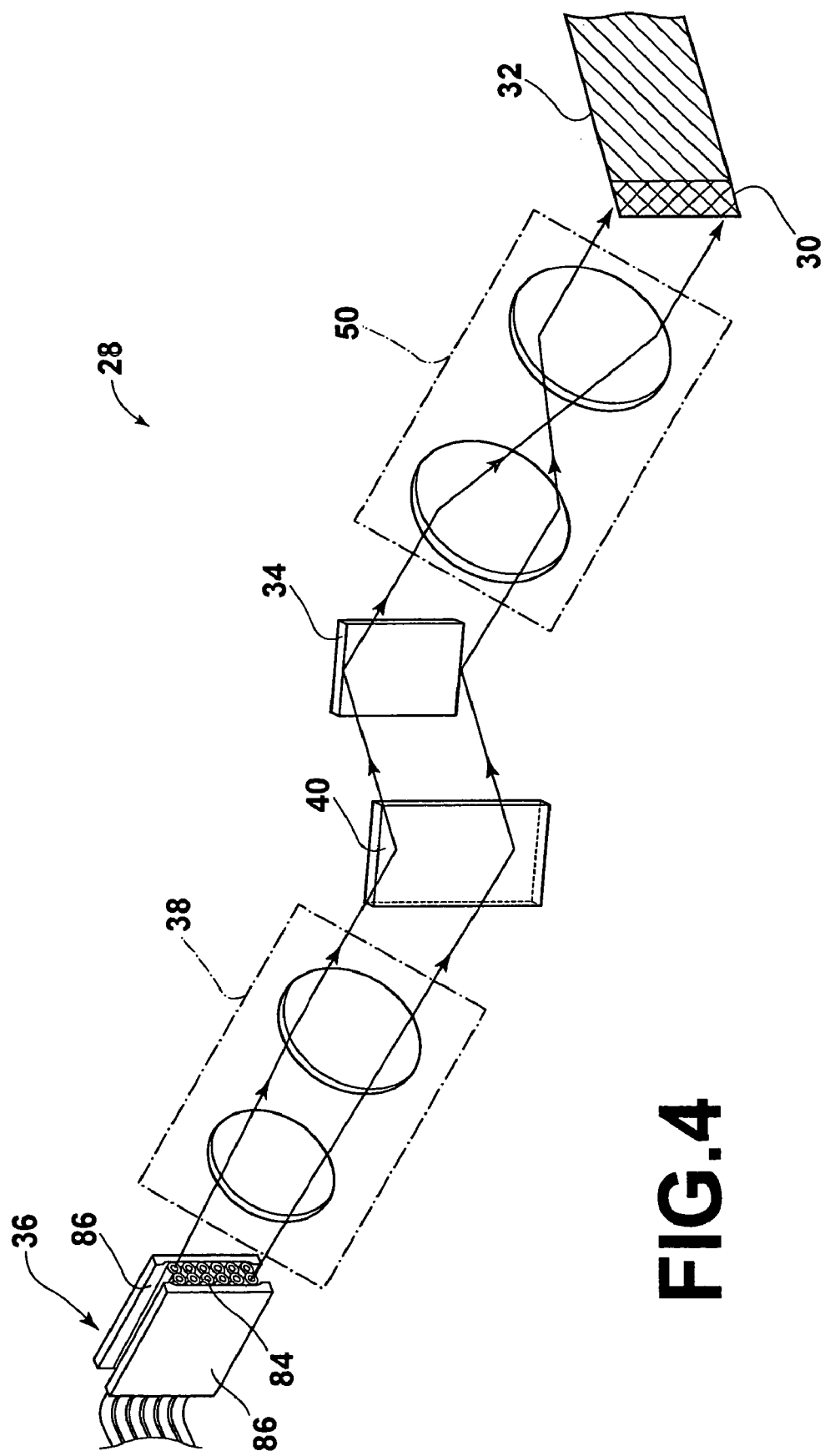
FIG. 4 is a perspective view of each exposure head of the image exposure device shown in FIG. 1.
Figure 5:
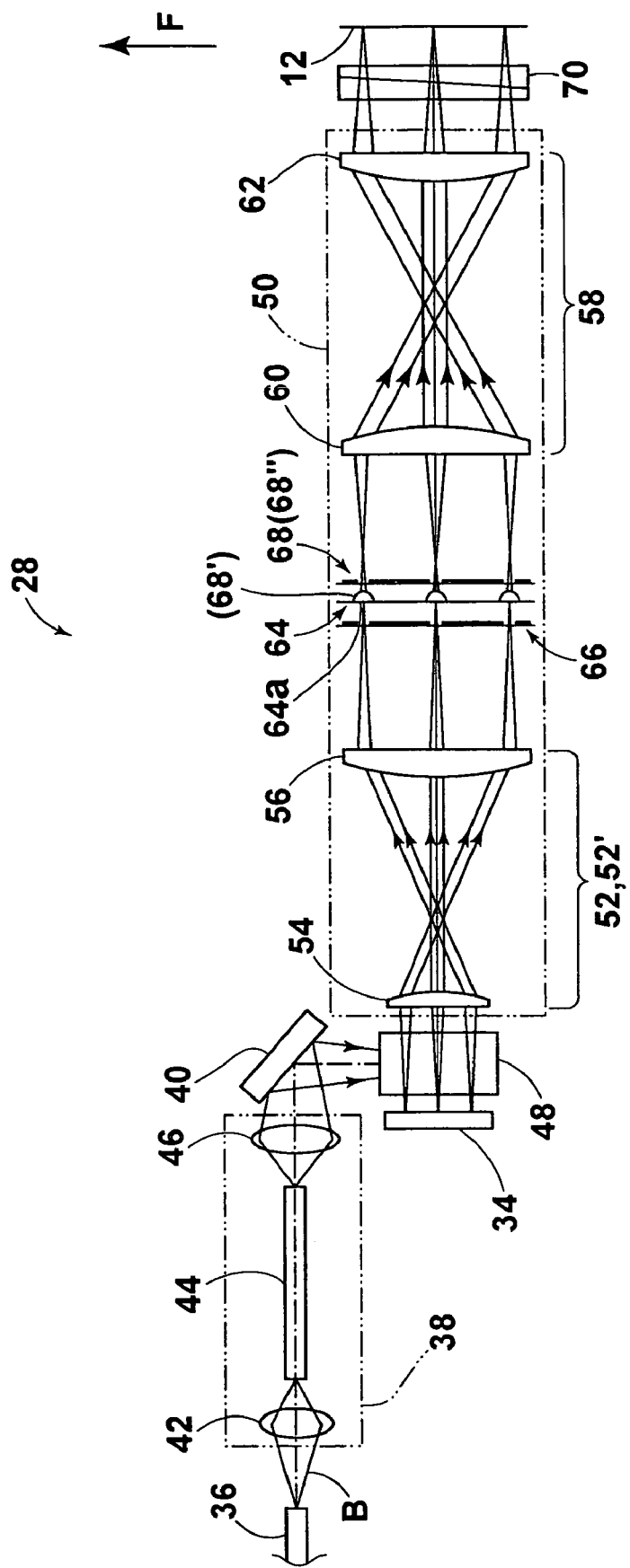
FIG. 5 is a sectional view of each exposure head of the image exposure device shown in FIG. 1.

Each of the exposure heads $28_{11}$ to $28_{mn}$ is equipped with a DMD (Texas Instrument) 50, which serves as a spatial light modulator for modulating an incident light beam for each pixel according to image data, as shown in FIGS. 4 and 5. The DMD 34 is connected to a controller 112 (see FIG. 20), which is equipped with a data processing section and a mirror driving section. The data processing section of the controller 112 is used for generating a control signal for driving and controlling each of the micro mirrors within an operating region of the DMD 34 for each exposure head 28, based on input image data. The mirror driving section of the controller 112 is used to control an angle of the reflecting surface of each micro mirror of the DMD 34 for each exposure head 28, based on the control signal generated by the image data processing section. Control of the angle of the reflecting surface of the micro mirror will be described later.

As shown in FIG. 4, a fiber array light source 36, a lens system 38, and a mirror 40 are arranged in this order on the entrance side of the DMD 34. The fiber array light source 36 is equipped with a laser emitting end in which the exit ends (emission points) of optical fibers are arranged in two rows along a direction corresponding to the direction of the long side of the rectangular exposure area 30. The lens system 38 corrects the laser light emitted from the fiber array light source 36 and converges the corrected laser light on the DMD 34. The mirror 40 reflects the laser light transmitted through the lens system 38, toward the DMD 34. Note in FIG. 4 that the construction of the lens system 38 is simplified.

As shown in FIG. 5, the lens system 38 comprises three major components: (1) a condenser lens 42 for converging laser light B (illuminating light) emitted from the fiber array light source 36; (2) a rod-shaped optical integrator (hereinafter referred to as a rod integrator) 44 inserted in the optical path of the laser light B passed through the condenser lens 42; and (3) an imaging lens 46 arranged in front of the rod integrator 44, that is, on the entrance side of the mirror 40. The rod integrator 44 is a light transmitting rod that is square in cross section. The laser light B emitted from the fiber array light source 36 is made uniform in intensity within the beam cross section as it propagates through the rod integrator 44 while being totally reflected, and strikes the DMD 34 as a nearly collimated beam of light that is uniform in intensity within the beam cross section. Note that the entrance end face and exit end face of the rod integrator 44 are coated with an antireflection film to enhance the transmittance.

The laser light B emitted from the lens system 38 is reflected at the mirror 40 and is irradiated to the DMD 34 through a total internal reflection (TIR) prism 48. In FIG. 4, the TIR prism 48 is omitted.

A main optics system 50 is disposed on the light reflection side of the DMD 34 so that an image by the laser light B reflected at the DMD 34 is formed on the photosensitive material 12. Note in FIG. 4 that the construction of the main optics system 50 is simplified. As shown in FIG. 5, the main optics system 50 includes (1) a first imaging optics system 52 comprising lenses 54 and 56; (2) a second imaging optics system 58 comprising lenses 60 and 62; (3) a micro lens array 64 inserted between the first and second imaging optics systems; (4) a first aperture array 66 disposed between the lens 56 and the micro lens array 64; and (5) a second aperture array 68 disposed between the micro lens array 64 and the lens 60.

The micro lens array 64 has a great number of micro lenses 64a, arranged two-dimensionally, which respectively correspond to some of all micro mirrors of the DMD 34 that are being used. In this example, among the 1024×768 micro mirrors of the DMD 34, only 1024×256 mirror mirrors are being used, and consequently, 1024×256 micro lenses 64a are arranged. In FIG. 5, only three micro lenses 64a are shown for clarity. The micro lenses 64a are arranged at intervals of 41 μm in the horizontal and vertical directions. In the preferred embodiment, each micro lens 64a is a plano-convex lens where the front face is plane and the back face is convex. One example is a plano-convex lens of quarts glass with a focal length of 0.23 mm and a numerical aperture (NA) of 0.09. In addition to the plano-convex lens, a biconvex lens, etc., may be employed. The micro lens array 64 may be formed as one body by forming the micro lenses 64a and the connecting portions between them with the same material. It may also be formed by inserting the micro lenses 64a into holes formed in a base plate.

The aforementioned first aperture array 66 and second aperture array 68 are provided with a large number of apertures that respectively correspond to the micro lenses 64a and are both arranged away from the micro lens array 64. The first aperture array 66 and second aperture array 68 are formed by forming apertures in a light intercepting film of chromium coated on a transparent support member of quarts glass. In FIG. 5, for clarity, only three apertures are shown for each aperture array, as with the aforementioned micro lenses 64a. Practically, 1024×256 apertures are arranged for each aperture array. The construction and operation of the first and second aperture arrays 66, 68 will be described in detail later.

The first imaging optics system 52 magnifies an image by the DMD 34 three times and forms the magnified image on the micro lens array 64. And the second imaging optics system 58 magnifies the image, formed on the micro lens array 64, 1.6 times and forms it on the photosensitive material 12. Therefore, an image by the DMD 34 is formed on the photosensitive material 12, magnified 4.8 times. Each of the first and second imaging optics systems 52, 58 is used for converting the beams of light from the DMD 34, to nearly collimated beams of light. In FIG. 5, for clarity, only three beams of light are shown.

In the preferred embodiment, a prism pair 70 is disposed between the second imaging optics system 58 and the photosensitive material 12. By moving the prism pair 70 vertically in FIG. 5, the focus of an image on the photosensitive material 12 can be adjusted. In the figure, the photosensitive material 12 is moved in the vertical scanning direction indicated by an arrow Y.

The DMD 34 has a great number of micro mirrors (e.g., 1024×768 micro mirrors) 74 arrayed in the form of a lattice on a SRAM cell 72, as shown in FIG. 6. Each of the micro mirrors 74 constitutes a pixel. Each pixel is provided with the rectangular micro mirror 74, which is supported by a mirror support post. The surface of the micro mirror 74 is coated with a high-reflectance material such as aluminum, etc. In the preferred embodiment, the reflectance of the micro mirror 74 is 90% or greater. As an example, the micro mirrors 74 are arrayed at intervals of 13.7 μm in the vertical and horizontal directions. Since there is a slight gap between the micro mirrors 74, the dimensions of each micro mirror 74 itself are 13.0 μm in length and breadth. The DMD 34 has a monolithically integrated structure where a great number of micro mirrors 74 are formed on the SRAM cell 72 of the CMOS silicon gate formed in the fabrication of ordinary semiconductor memory, through mirror support posts including a hinge and a yoke.

If a digital signal is written to the SRAM cell 72 of the DMD 34, each micro mirror 74 supported by a support post is inclined at either $+\alpha°$ or $-\alpha°$ (for example, ±12 degrees in the preferred embodiment) to the base plate on which the DMD 34 is arranged, with the diagonal line as center. FIG. 7A shows the ON state of the micro mirror 74 inclined at $+\alpha°$. FIG. 7B shows the OFF state of the micro mirror 74 inclined at $-\alpha°$. Therefore, if the inclination of each micro mirror 74 constituting each pixel of the DMD 34 is controlled as shown in FIG. 6 in dependence on an image signal, the laser light B incident on the DMD 34 is reflected in the direction of the inclination of the micro mirror 74. In switching each of the micro mirrors 74 of the DMD 34 to the ON state or OFF state, the problem of chattering will arise. That is, it takes a slight time for the ON state or Off state to become stable. For example, in the DMD 34 (Texas Instrument) employed in the preferred embodiment, if each micro mirror 74 is switched to the ON state or OFF state, the micro mirror 74 will vibrate in the range of about ±1° with the original set angle as center and it will take 20 micro seconds for the ON state or OFF state to become stable.

FIG. 7A shows the state in which the micro mirror 74 of the DMD 34 is controlled to +12°. FIG. 7B shows the state in which the micro mirror 74 is controlled to −12°. The ON-OFF control of each micro mirror 74 is performed by the aforementioned controller 112 connected to the DMD 34. Note that there is arranged a light absorbing body (not shown) in a direction where the laser light B reflected at the micro mirror 74 in the OFF state travels.

Figure 8B:
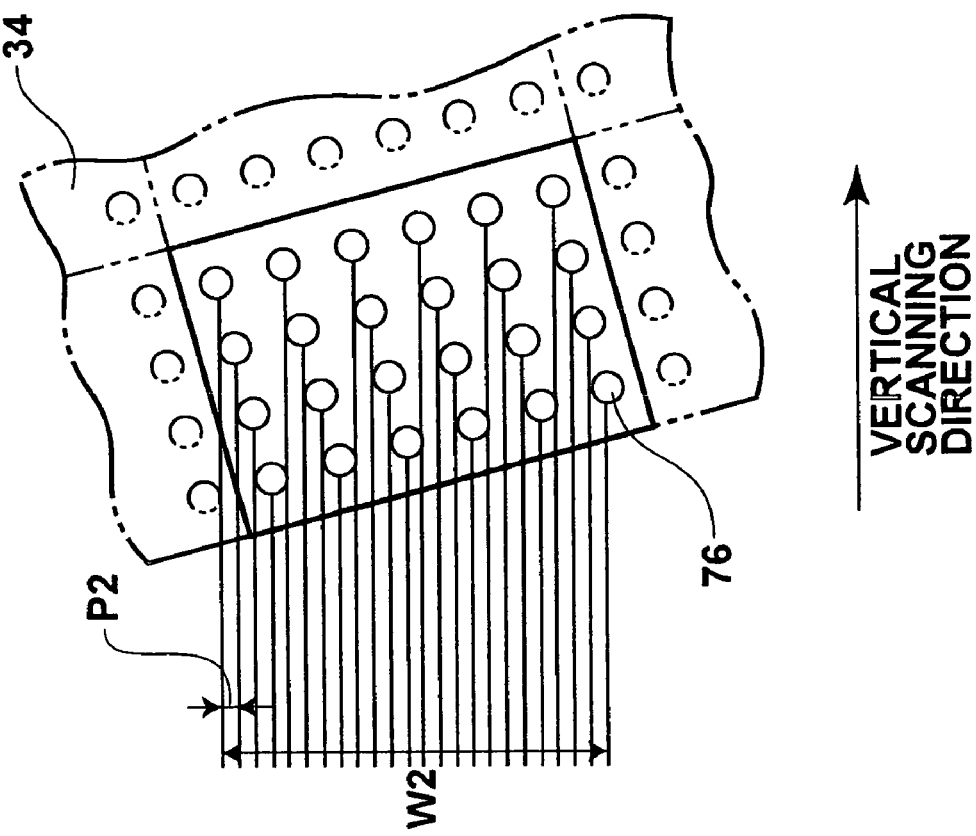
FIG. 8B is a plan view showing the arrangement of exposure beams and scanning lines in the case where the DMD is obliquely arranged.
Figure 8A:
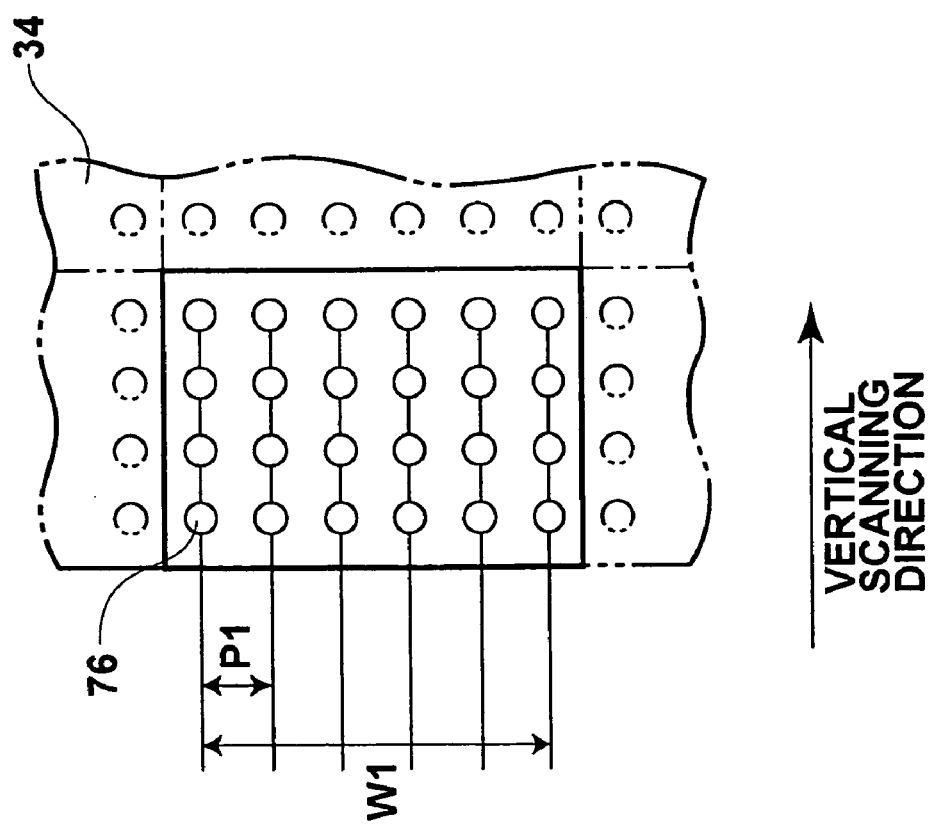
FIG. 8A is a plan view showing the arrangement of exposure beams and scanning lines in the case where the DMD is not obliquely arranged.

It is preferable that the DMD 34 be obliquely arranged so that the short side makes a predetermined angle θ (e.g., 0.2° to 2°) with the vertical scanning direction. FIG. 8A shows the scanning loci of the exposure beams 76, reflected and modulated by the micro mirrors when the DMD 34 is not obliquely arranged. FIG. 8B shows the scanning loci of the exposure beams 76 when the DMD 34 is obliquely arranged.

In the DMD 34, a great number of micro mirrors 74 (e.g., 1024 micro mirrors) are arrayed in the longitudinal direction and a great number of sets of the micro mirrors 74 are arrayed in the transverse direction. If the DMD 34 is obliquely arranged as shown in FIG. 8B, the pitch $P_2$ between the scanning loci (scanning lines) of the exposure beams 76 becomes narrower than the pitch $P_1$ between the scanning lines in the case where the DMD 34 is not obliquely arranged, and consequently, resolution can be considerably enhanced. On the other hand, since an angle at which the DMD 34 is obliquely arranged is slight, the scanning width $W_2$ in the case where the DMD 34 is obliquely arranged is approximately the same as the scanning width $W_1$ in the case where the DMD 34 is not obliquely arranged.

In addition, the same scanning line is repeatedly exposed by different rows of micro mirrors 74. If multiple exposure is thus performed, a very small amount of exposure position can be controlled and high-definition exposure can be realized. Furthermore, a difference in exposure between the exposure heads 28 arrayed in the horizontal direction can be eliminated by a vary small amount of exposure position control.

Even if, instead of obliquely arranging the DMD 34, each micro mirror row is arranged in zigzag by being shifted a predetermined distance in a direction perpendicular to the vertical direction, the same effect can be obtained.

Figure 9A:
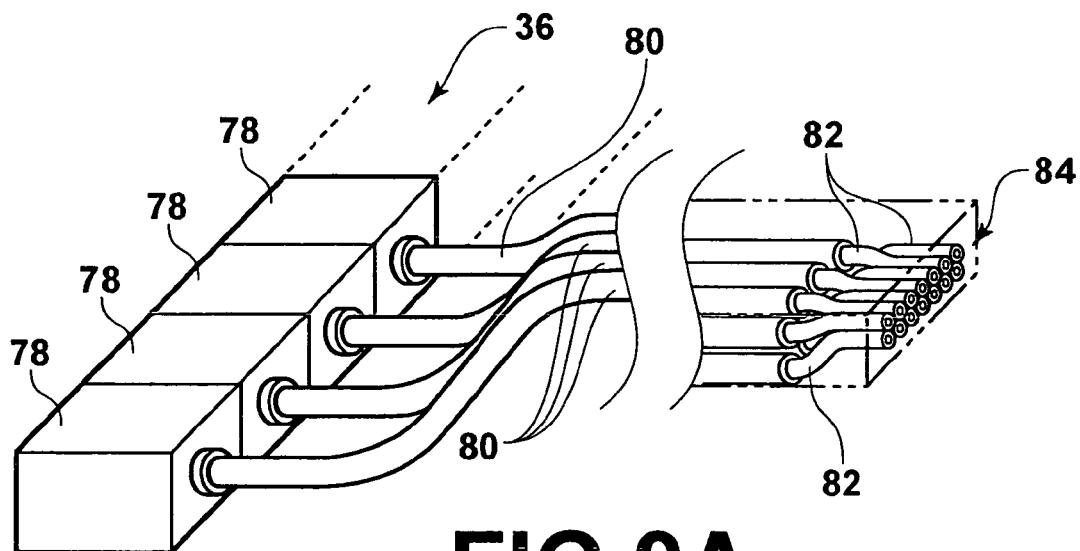
FIG. 9A is a perspective view showing a fiber array light source.
Figure 9B:
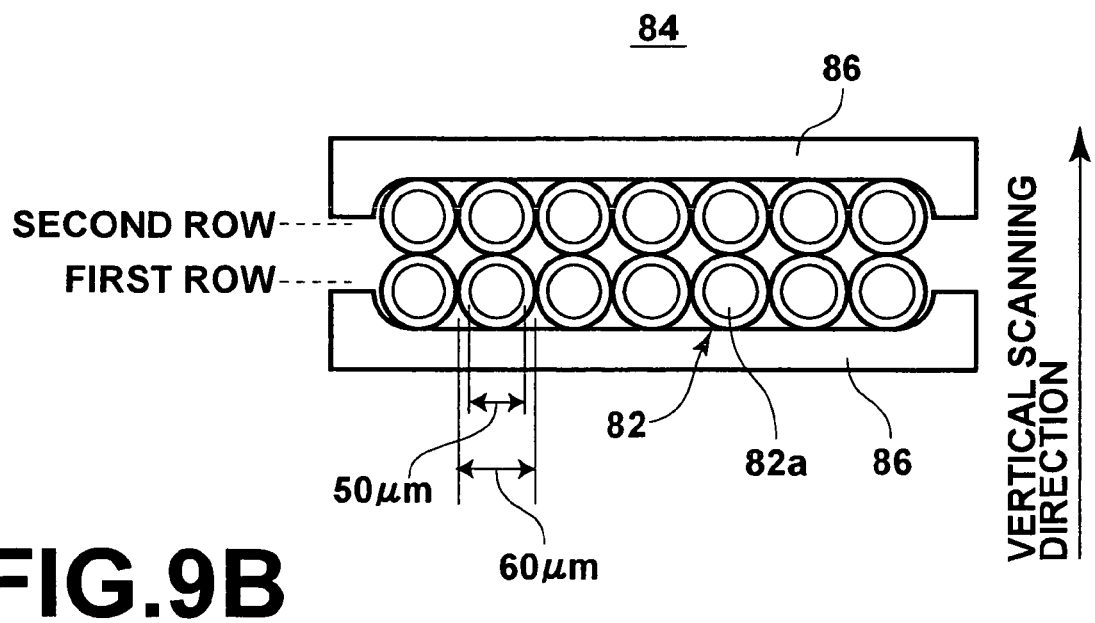
FIG. 9B is a front view showing the arrangement of the emission points in the laser emitting end of the fiber array light source.

The fiber array light source 36 is equipped with a plurality of laser modules 78 (e.g., fourteen laser modules 78), as shown in FIG. 9A. Each laser module 78 is joined with one end of a large-diameter multimode fiber 80. The other end of the large-diameter multimode fiber 80 is joined with one end of a small-diameter multimode fiber 82 having a cladding layer smaller in diameter than that of the large-diameter multimode fiber 80. As shown in FIG. 9B, a laser emitting end 84 comprises two rows of seven small-diameter multimode fibers 82 arranged in the horizontal scanning direction perpendicular to the vertical scanning direction.

The ends of the small-diameter multimode fibers 82 of the laser emitting end 84 are interposed and fixed between two flat support plates 86, 86. The exit end face of the large-diameter multimode fiber 80 preferably has a protective plate such as glass in order to protect that end. The exit end face of the large-diameter multimode fiber 80 is easily covered with dust and degraded due to high light density, but if it has such a protective plate, the adhesion of dust to the end face can be prevented and degradation can be retarded.

Figure 10:
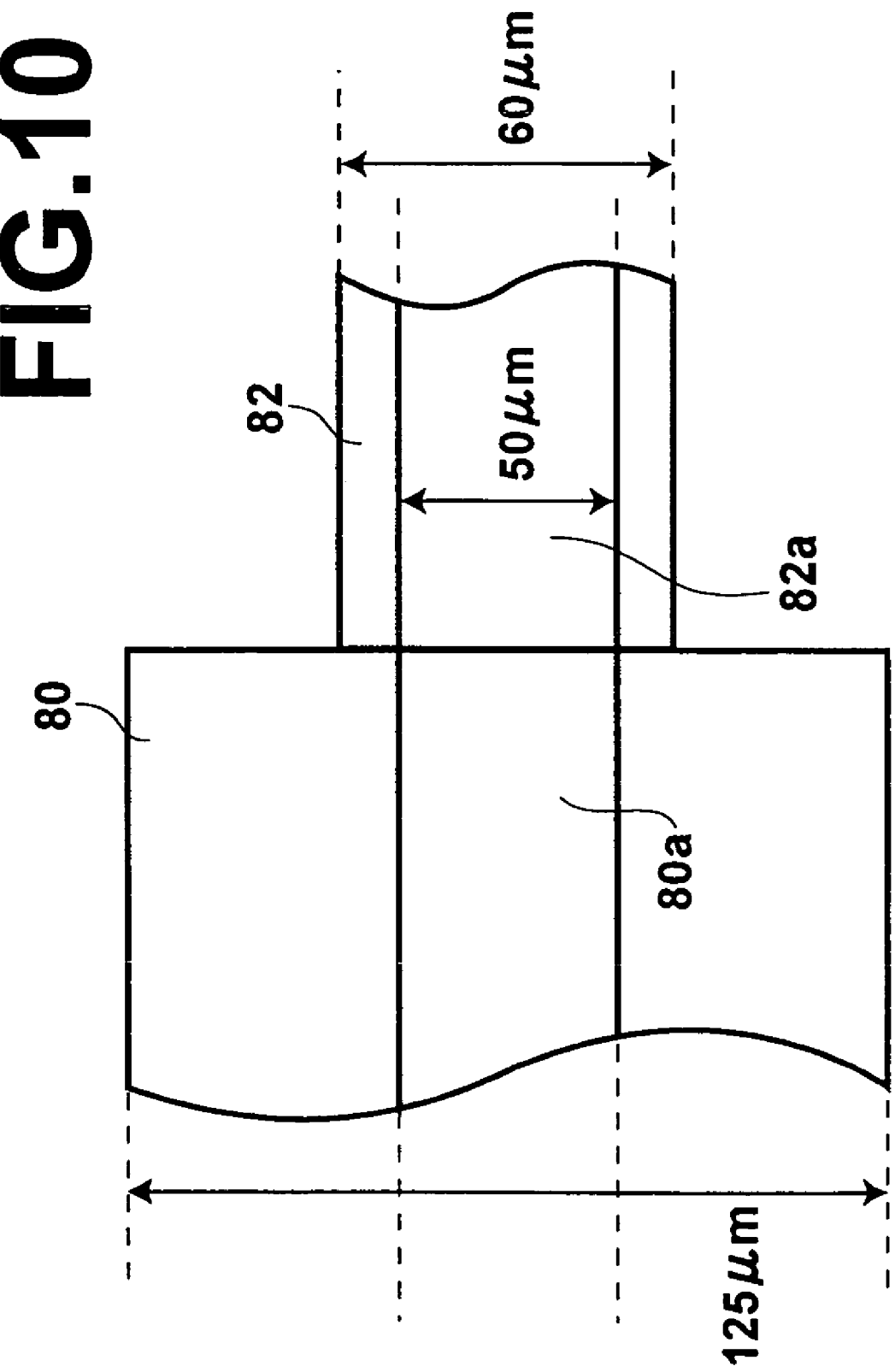
FIG. 10 is a part-enlarged view showing a multimode fiber.

In the preferred embodiment, as shown in FIG. 10, the exit end face of the large-diameter multimode fiber 80 is coaxially joined to the small-diameter multimode fiber 82 of 1 m to about 30 cm in length. More specifically, the exit end face of the large-diameter multimode fiber 80 is joined to the entrance end face of the small-diameter multimode fiber 82 by fusing in such a way that the core 80$a$ of the large-diameter multimode fiber 80 is aligned with the core 82$a$ of the small-diameter multimode fiber 82.

The multimode fibers 80, 82 may be step-index fibers, graded-index fibers, and composite fibers. For example, step-index fibers (Mitsubishi Cable) can be employed. In the preferred embodiment, multimode fibers 80, 82 are step-index fibers. The large-diameter multimode fiber 80 has a cladding diameter of 125 µm, a core diameter of 50 µm, and an NA of 0.2, and the coating on the entrance end face has a transmittance of 99.5% or greater. The small-diameter multimode fiber 82 has a cladding diameter of 60 µm, a core diameter of 50 µm, and an NA of 0.2.

The diameter of the cladding layer of the small-diameter multimode fiber 82 is not limited to 60 µm. The diameter of the cladding layer of many optical fibers used in conventional fiber light sources is 125 µm. However, as the cladding diameter becomes smaller, the focal depth becomes deeper. Therefore, it is preferable that the cladding diameter of the multimode fiber be 80 µm or less and further preferable that it be 60 µm or less. On the other hand, the core diameter requires at least 3 to 4 µm, so the cladding diameter of the small-diameter multimode fiber 82 is preferably 10 µm or greater.

The present invention does not always need to employ two kinds of multimode fibers 80 and 82 different in cladding diameter, as described above. For example, the present invention may constitute a fiber array light source by bundling a plurality of optical fibers that are constant in cladding diameter (e.g., the optical fiber 80 in FIG. 9A).

Figure 11:
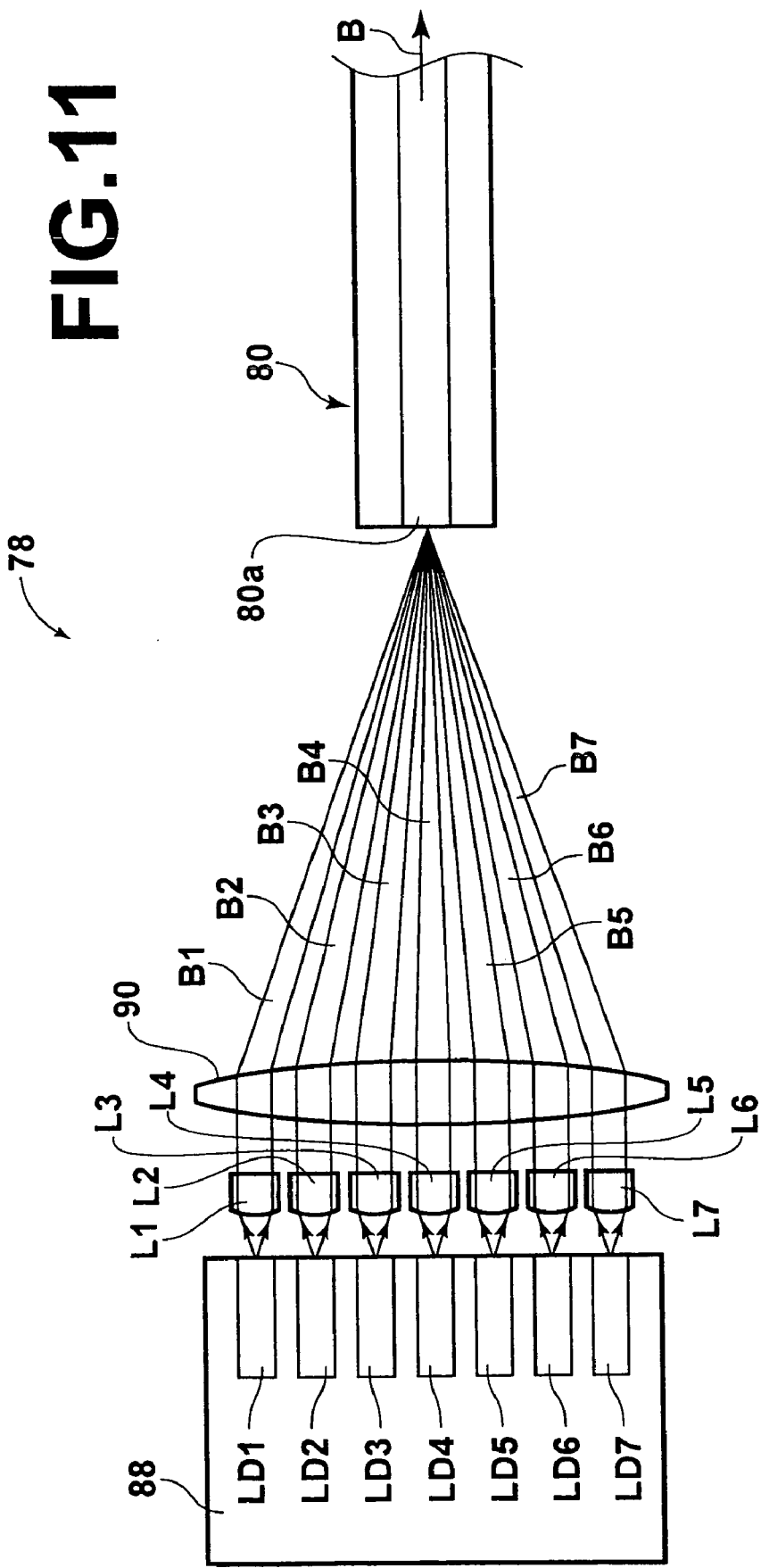
FIG. 11 is a plan view showing a multiplex laser light source.

The laser module 78 is constructed of a multiplex laser light source (fiber light source) shown in FIG. 11. This multiplex laser light source comprises four components: (1) a plurality of transverse multimode or single mode GaN semiconductor lasers (e.g., seven lasers) LD1, LD2, LD3, LD4, LD5, LD6, and LD7 mounted on a heat block 88; (2) collimator lenses L1, L2, L3, L4, L5, L6, and L7 provided so that they correspond to the GaN semiconductor lasers LD1, LD2, LD3, LD4, LD5, LD6, and LD7; (3) a single condenser lens 90; and (4) a single multimode fiber 80. Note that the number of semiconductor lasers is not limited to seven, but numbers other than seven may be adopted. Also, instead of seven separate collimator lenses L1 to L7, a collimator lens array in which those lenses are integrally formed may be employed.

The GaN semiconductor lasers LD1 to LD7 are nearly the same in oscillation wavelength (e.g., 405 nm) and nearly the same in maximum output (e.g., 100 mW for multimode lasers and about 50 mW for single mode lasers). The GaN semiconductor lasers LD1 to LD7 may employ lasers that oscillate at wavelengths other than 405 nm, in the wavelength range of 350 to 450 nm.

Figure 12:
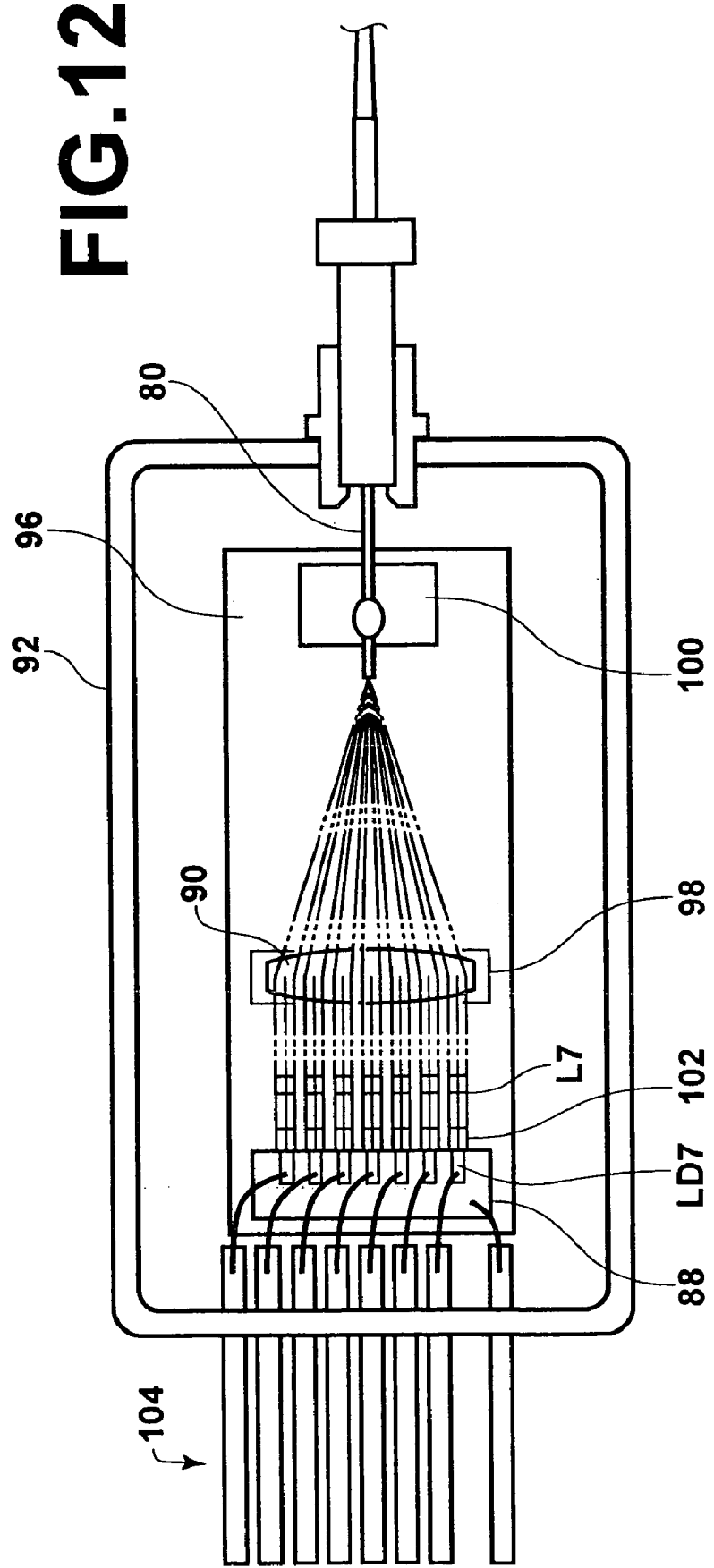
FIG. 12 is a plan view showing a laser module.
Figure 13:
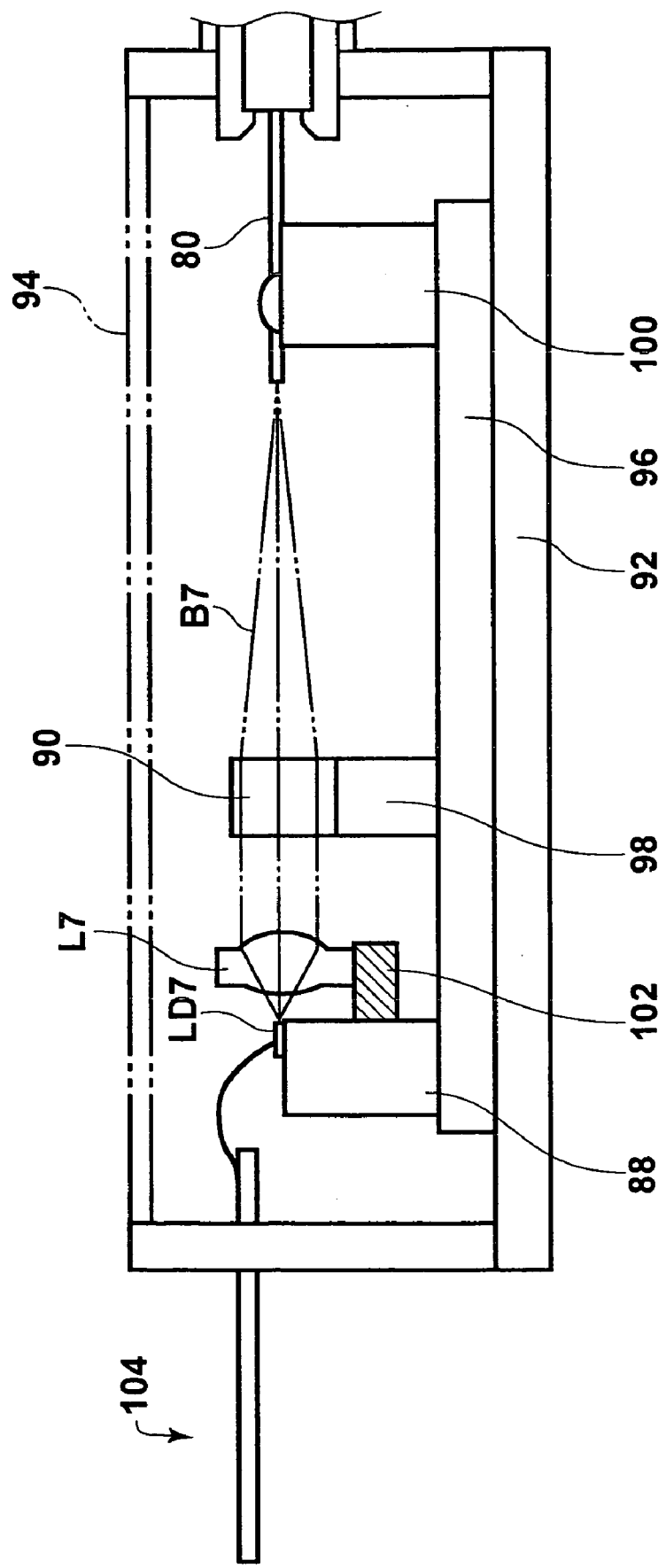
FIG. 13 is a side view of the laser module shown in FIG. 12.

The multiplex laser light source 78 is contained in an open box-shaped package 92 along with other optics, as shown in FIGS. 12 and 13. The package 92 is equipped with a package cover 94 to close the opening. By introducing sealing gases into the package 92 after a deaerating process and closing the opening of the package 92 with the package cover 94, the aforementioned multiplex laser light source 78 is hermetically sealed within the closed space (sealed space).

A base plate 96 is fixed on the bottom surface of the package 92, and the aforementioned heat block 88, a condenser-lens holder 98 for holding the condenser lens 90, and a fiber holder 100 for holing the entrance end portion of the multimode fiber 80 are mounted on the top surface of the base plate 96. The exit end portion of the multimode fiber 80 extends through an opening formed in a wall of the package 92 and is pulled out of the package 92.

A side surface of the heat block 88 has a collimator lens holder 102 attached thereto, and the collimator lenses L1 to L7 are mounted on the collimator lens holder 102. A transverse wall surface of the package 92 has an opening through which wires 104 for supplying drive current to the GaN semiconductor lasers LD1 to LD7 are pulled out of the package 92.

In FIG. 13, for clarity, only the GaN semiconductor laser LD7 of a plurality of GaN semiconductor lasers is given a reference number, and only the collimator lens L7 of a plurality of collimator lenses is given a reference number.

Figure 14:
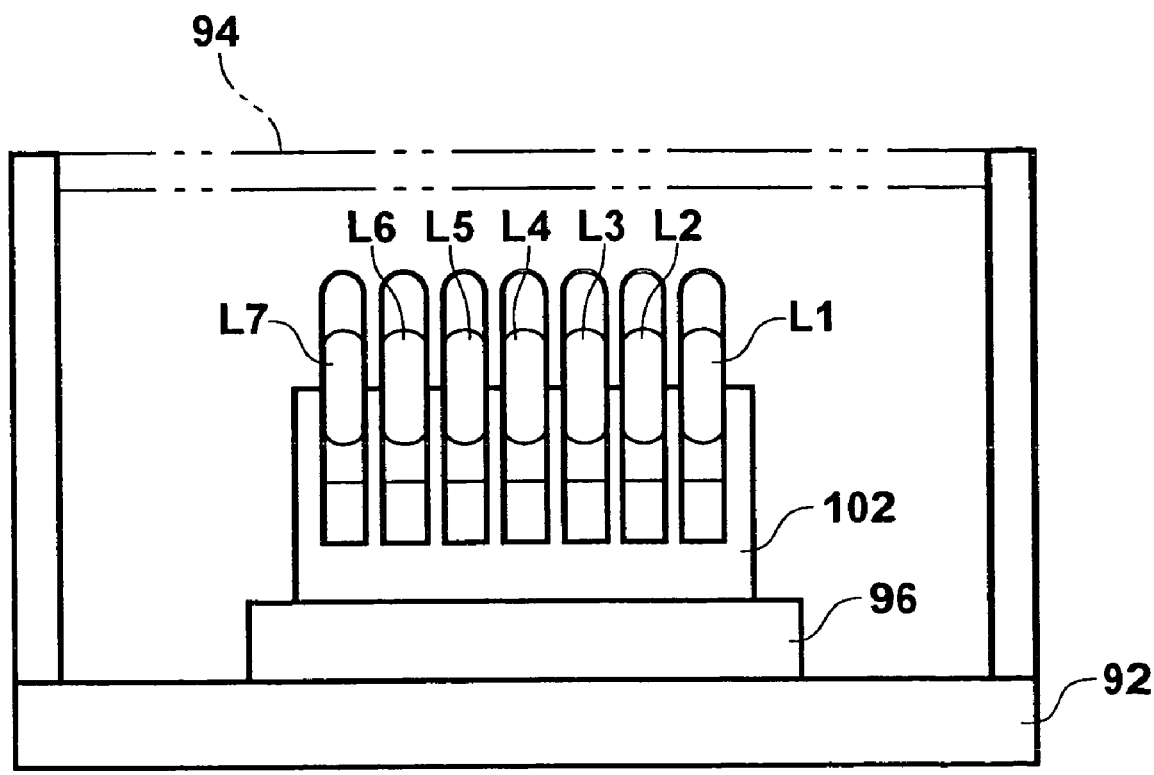
FIG. 14 is a part-plan view of the laser module shown in FIG. 12.

FIG. 14 shows a front view of the collimator lens L1 to L7. Each of the collimator lenses L1 to L7 is formed by slenderly cutting off a region that contains the optical axis of a circular lens having a non-spherical surface, along a parallel plane. The slender collimator lens can be formed, for example, by molding resin or optical glass. The collimator lenses L1 to L7 are placed close to each other in the arrangement direction (the right-and-left direction in FIG. 14) of the emission points of the GaN semiconductor lasers LD1 to LD7 so that the length direction is perpendicular to the arrangement direction.

The GaN semiconductor lasers LD1 to LD7 employ lasers are equipped with an active layer having an emission width of 2 µm and emit laser beams B1 to B7 when the beam divergence angles in the directions parallel to and perpendicular to the active layer are 10° and 30°. These GaN semiconductor lasers LD1 to LD7 are placed so that the emission points are arranged in a row in a direction parallel to the active layer.

Therefore, the laser beams B1 to B7 emitted from the emission points enter the collimator lens L1 to L7 so that the direction in which the divergence angle is great is aligned with the length direction and the direction in which the divergence angle is small is aligned with the width direction perpendicular to the length direction. In the preferred embodiment, each of the collimator lenses is 1.1 mm in width and 4.6 mm in length. The beam diameter of each of the laser beams B1 to B7 that enter the collimator lenses L1 to L7 is 0.9 mm in the horizontal direction and 2.6 mm in the vertical direction. Each of the collimator lenses L1 to L7 has a focal length of 3 mm and NA of 0.6, and a pitch between lenses is 1.25 mm.

The condenser lens 90 is formed by slenderly cutting off a region which contains the optical axis of a circular lens having a non-spherical surface, along a parallel plane. Also, the condenser lens 90 is made longer in the arrangement direction of the collimator lenses L1 to L7, that is, in the horizontal direction and shorter in a direction perpendicular to the horizontal direction. This condenser lens 90 has a focal length $f_2$ of 23 mm and NA of 0.2 and can also be formed by molding resin or optical glass.

Now, the construction and operation of each of the first and second aperture arrays 66, 68 will be described with reference to FIGS. 15 to 18.

Figure 15:
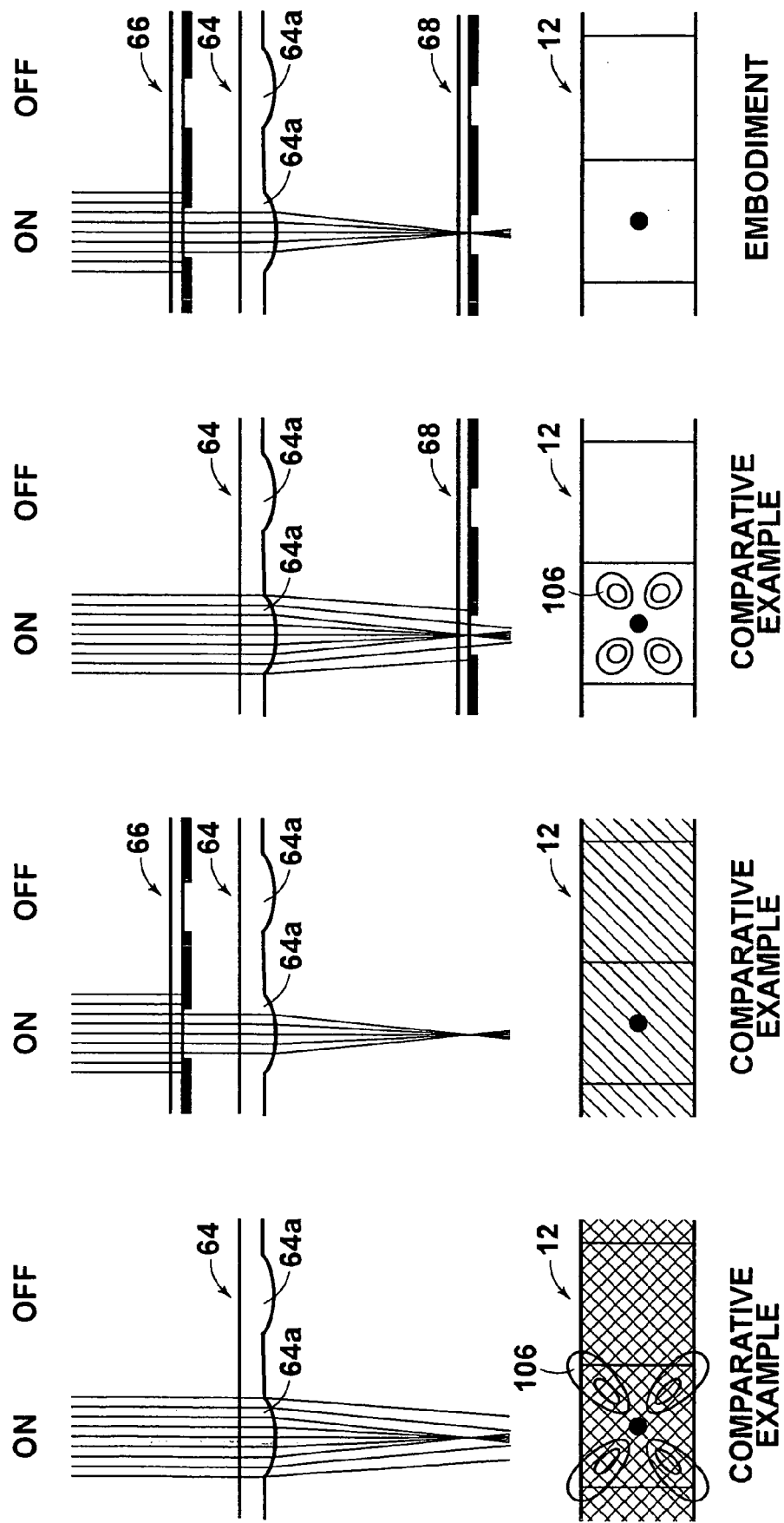
FIG. 15, which includes

In FIG. 15, three comparative examples and an embodiment of the present invention are compared with regard to removal of stray light and assurance of a high total extinction ratio. The upper portion of each of FIGS. 15A to 15D shows an enlarged sectional view of the two micro lenses 64a corresponding to two adjacent micro mirrors 74 in the ON and OFF states and the locus of a light beam passed through the micro lens, while the lower portion shows an enlarged plan view of an image formed on the photosensitive material 12 by the light beam passed through the micro lens 64a.

In a first comparative example shown in FIG. 15A, no aperture array is provided in the stage before the micro lens array 64 and in the stage after the micro lens array 64. In the first comparative example, the marginal portion of a beam of light emitted from the micro mirror 74 in the ON state, that is, the stray light component that will not suitably form an image on the photosensitive material 12, cannot be removed. For that reason, undesirable images 106 due to stray light are formed around an image point on the photosensitive material 12. In addition, the scattered light component due to the DMD 34 and the marginal light component due to the irregular reflection and multiple reflection in the micro lens array 64 cannot be removed. For that reason, as shown in the shaded lower portion of FIG. 15A, the entirety of the photosensitive material 12 is exposed, including pixels that correspond to the micro mirror 74 in the OFF state. Therefore, a high total extinction ratio cannot be assured.

In a second comparative example shown in FIG. 15B, a single aperture array 66 is provided only in the stage before the micro lens array 64. In the second comparative example, the aforementioned stray light component that will not suitably form an image on the photosensitive material 12 can be removed, but the scattered light component due to the DMD 34 and the marginal light component due to the irregular reflection and multiple reflection in the micro lens array 64 cannot be reduced. For that reason, as shown in the shaded lower portion of FIG. 15B, the entirety of the photosensitive material 12 is exposed with the marginal light component. Therefore, a high total extinction ratio on the photosensitive material 12 is higher than that of the first comparative example of FIG. 15A, but is not a sufficient level.

In a third comparative example shown in FIG. 15C, a single aperture array 68 is provided only in the stage after the micro lens array 64. In the third comparative example, the marginal light component can be satisfactorily shut off, but the aforementioned stray light component cannot be completely removed. As with the first comparative example, undesirable images 106 due to stray light are formed around an image point on the photosensitive material 12. If the size of each aperture in the aperture array 68 is made sufficiently smaller according to the diameter of the image-forming component of a beam of light, it is also possible to completely remove the stray light component. However, in such a case, the position of the aperture array 68 relative to the micro lens array 64 must be very strictly controlled and alignment becomes extremely difficult and impractical.

In a first embodiment of the present invention shown in FIG. 15D, a first aperture array 66 is provided in the stage before the micro lens array 64 and a second aperture array 68 is provided in the stage after the micro lens array 64. According to this construction, the stray light component can be removed by the first aperture array 66, and the scattered light component due to the DMD 34 and the marginal light component due to the irregular reflection and multiple reflection in the micro lens array 64 can be reduced by the second aperture array 68. Therefore, removal of stray light and assurance of a high total extinction ratio can be realized at the same time and an exposed image of extremely high sharpness can be obtained on the photosensitive material 12. Furthermore, since the stray light component is removed by the first aperture array 66, the size of each aperture in the second aperture array 68 does not need to make smaller for the purpose of removing stray light. The size of each aperture in the second aperture array 68 will do if it can shut off the marginal light component due to scattering, irregular reflection, and multiple reflection and ensure a sufficient total extinction ratio. Therefore, alignment of the aperture arrays 66, 68 and micro lens array 64 can be easily performed.

Figure 16:
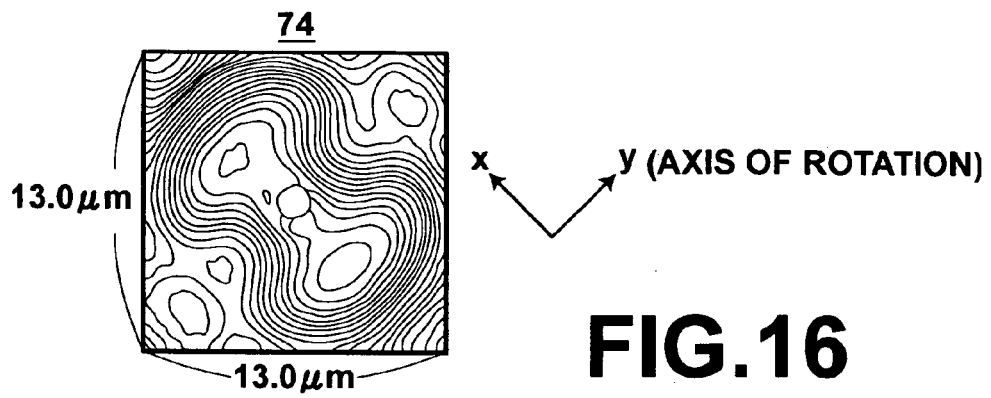
FIG. 16 is a plan view showing the strains of the reflecting surface of each micro mirror constituting the DMD by contour lines.
Figure 17A:
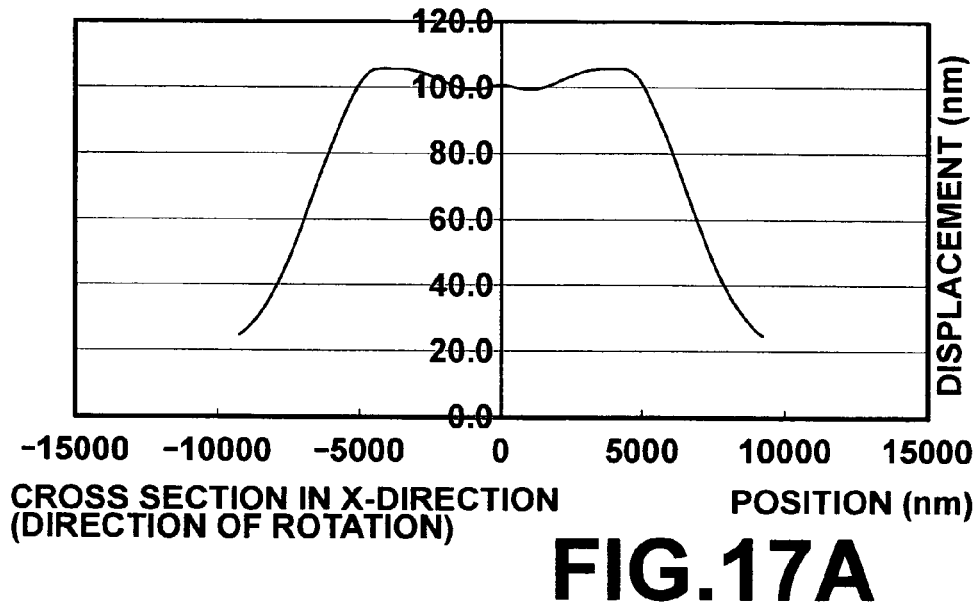
FIGS. 17A and 17B are graphs showing the strains of the reflecting surface of each micro mirror in the two diagonal directions of the micro mirror.
Figure 17B:
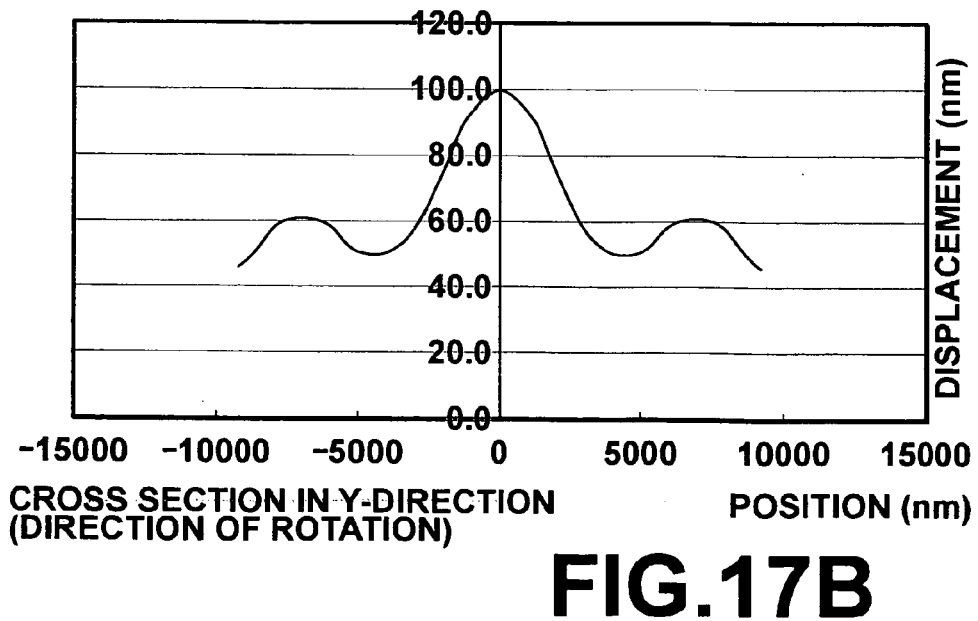

It has been found that when the DMD 34 is employed as a spatial light modulator, as in the preferred embodiment of the present invention, the aforementioned stray light component that does not suitably form an image will result from the strain of the marginal portion of each micro mirror constituting the DMD 34. FIG. 16 shows the flatness of the reflecting surface of each micro mirror 74 constituting the DMD 34, obtained by actual measurements. In the figure, the same height positions of the reflecting surface are linked together by a contour line. The pitch between contour lines is 5 nm. The x and y directions shown in the figure represent the directions of the two diagonals of the micro mirror 74, and as described above, the micro mirror 74 rotates on an axis of rotation extending in the y direction. FIGS. 17A and 17B show the displacement of the height position of the reflecting surface of the micro mirror 74 along the x and y directions, respectively. As shown in FIGS. 16 and 17, the reflecting surface of the micro mirror 74 has strains, and the rate of change of the strain is gradually increased as it goes from the center of the micro mirror 74 to the marginal portion. The strain in the rotation axis direction (y direction) of the micro mirror 74 is greater than that in the diagonal direction (x direction).

Hence, in the preferred embodiment using the DMD 34, it is preferable that the size of each aperture in the aperture array 66 be made small to the degree that the reflected light (at least 0-order light) from the marginal portion where a quantity of change in the strain of each micro mirror 74 is great can be shut off. In the preferred embodiment, as previously described, the size of each micro mirror 74 is 13.0 μm×13.0 μm and the first imaging optics system 52 has a magnification of 3, so the diameter of each light beam just before reaching the first aperture array 66 is about 39 μm. In such a case, as a preferred example, the size of each aperture in the first aperture array 66 is about 34 μm and the size of each aperture in the second aperture array 68 is about 12 μm.

As previously described, the first aperture array 66 and second aperture array 68 in the preferred embodiment are formed by forming apertures in a light-intercepting film of chromium attached to a transparent support member of quartz glass. Thus, two aperture arrays are employed. Therefore, even if the light-intercepting film of each aperture array is made thinner compared with the case of employing only a single aperture array, sufficient light interception can be assured. If the light-intercepting film of each aperture array is thus made thinner, the strain of each aperture array due to the absorption of heat by the light-intercepting film can be prevented.

In FIGS. 18A to 18D, three comparative examples and an embodiment of the present invention are compared with regard to a reduction in the position fluctuation of an exposed point due to chattering. Each of the figures shows an enlarged part-sectional view of a single micro mirror 74 on the DMD 34 and a micro lens 64a corresponding to that mirror. Practically, the TIR prism 48 and first imaging optics system 52 are arranged between the micro mirror 74 and micro lens 64a (see FIG. 5), but in FIG. 18, they are omitted for clarity. The solid line in FIG. 18 represents the locus of light reflected at the marginal portion of the micro mirror 74 when it is in a stable state at the original set angle, while the broken line represents the locus of the reflected light when the micro mirror 74 is vibrating due to chattering.

In a fourth comparative example of FIG. 18A having no aperture array, all light components due to chattering reach the photosensitive material 12, as indicated by broken lines. Therefore, the position of an exposed point fluctuates and the sharpness of an exposed image is reduced. In fifth and sixth comparative examples of FIGS. 18B and 18C where only a single aperture array is provided in the stage before or after the micro lens array 64, many of the light components due to chattering similarly reach the photosensitive material 12, as shown in the figures.

On the other hand, in a second embodiment of the present invention shown in FIG. 18D, a first aperture array 66 is provided in the stage before the micro lens array 64, and a second aperture array 68 is provided in the stage after the micro lens array 64. As shown in the figure, the light components due to chattering can be satisfactorily shut off. In this manner, fluctuations in the position of an exposed point on the photosensitive material 12 can be reduced and high-definition images can be obtained.

The aforementioned embodiment employs a total of two aperture arrays, first aperture array 66 and second aperture array 68, but may employ three or more aperture arrays.

From the standpoint of realizing removal of stray light, assurance of a high total extinction ratio, and ease of alignment at the same time, it is also preferable to provide a total of two or more aperture arrays in the stage before the micro lens array and/or the stage after the micro lens array. Even in the case where two or more aperture arrays are provided only in the stage before or after the micro lens array, it is possible to shut off the light components that cause position fluctuations by operation of apertures arranged in parallel to each other. Therefore, such a modification is intended to be included within the scope of the present invention.

In the aforementioned embodiment, each aperture array is arranged away from the micro lens array 64. However, the present invention may include an aperture array constructed by attaching a mask to the front surface or back surface of the micro lens array 64.

An aperture array constructed by attaching a mask to the front surface or back surface of the micro lens array 64 will hereinafter be described in detail.

Figure 19A:
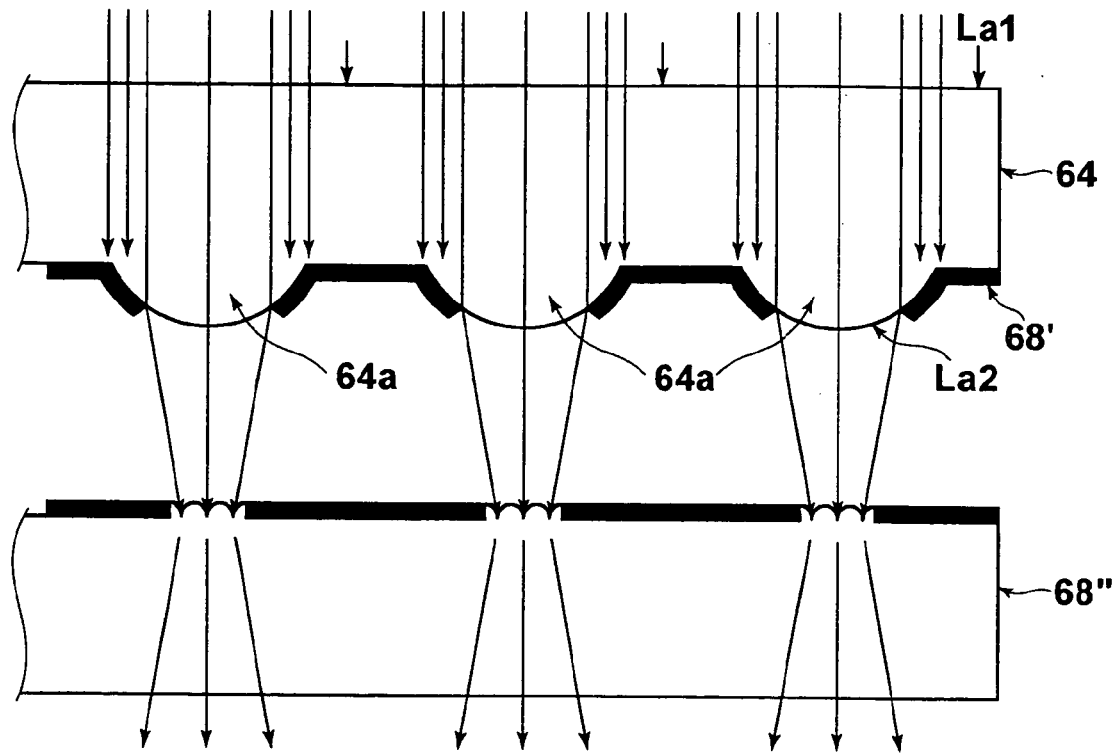
FIG. 19A is an enlarged sectional view showing an aperture array stuck on a lens surface of the micro lens array.
Figure 19B:
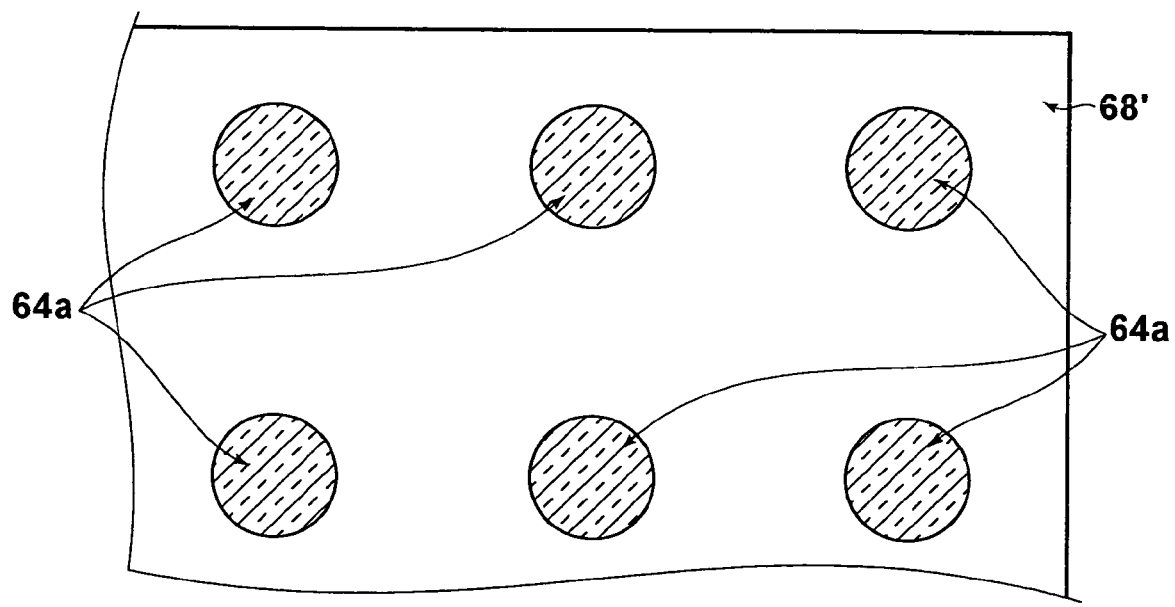
FIG. 19B is an elevational view showing the aperture array stuck on the lens surface of the micro lens array.

FIG. 19A shows an enlarged sectional view of an aperture array stuck on a lens surface of the micro lens array. FIG. 19B shows an elevational view of the aperture array stuck on the lens surface of the micro lens array.

As shown in the figures, between the lens surfaces La1 and La2 of the micro lens 64a of the micro lens array 64, a first aperture array 68' is stuck on the lens surface La2 that is greater in refracting power and arranged on the downstream side of the propagation direction of the aforementioned light beam, and comprises a light-intercepting film of chromium (chromium mask). The first aperture array 68' is stuck on the lens surface La2 and the surface of the micro lens 64a of the marginal portion of the lens surface La2 by coating or adhesion.

In the case of the aforementioned construction, it is desirable that respective images by the micro mirrors 74 of the DMD 34, which are the pixel portions of a spatial light modulator, be formed on the lens surfaces La2 of the micro lens array 64 by the imaging optics system. FIG. 19A shows the case equipped with a first imaging optics system 52' by which respective images by the micro mirrors 74 is formed on the lens surfaces La2 of the micro lens array 64 (see FIG. 5). That is, an image by the micro mirror 74 of the DMD 34 is formed by the first imaging optics system 52', and at the position where the image is formed, the lens surface La2 of the micro lens array 64 with the first aperture array 68' is arranged.

In the aforementioned construction, only the light reflected at an aberration-reduced region of the central portion of the micro lens mirror 74 of the DMD 34 can be passed through the apertures of the first aperture array 68'. Therefore, the performance of converging a beam of light on the photosensitive material 12 can be improved.

That is, if an image by the micro mirror 74 formed by the first imaging optics system 52' is formed on the lens surface La2, and the first aperture array 68' is arranged on the lens surface La2, only the light reflected at an aberration-reduced region of the central portion of the micro mirror 74 can be passed through the apertures of the first aperture array 68' and light other than that can be shut off with the first aperture array 68'.

In addition, if a second aperture array 68" is arranged on the downstream side of the first aperture array 68', scattered light components due to the DMD 34 and marginal light components due to irregular reflection and multiple reflection at the micro lens array 64 can be reduced by the second aperture array 68". Therefore, the quality of light used for exposure of the photosensitive material 12 can be enhanced and an image of higher definition can be formed on the photosensitive material 12.

Now, the electrical construction of the image exposure device of the preferred embodiment will be described with reference to FIG. 20. An entirety control section 108 is connected with a modulation circuit 110, which is in turn connected to a controller 112 for controlling the DMD 34. The entirety control section 108 is also connected with an LD drive circuit 114 for driving the laser module 78. The entirety control section 108 is further connected with a stage driver 116 for driving the aforementioned stage 14.

The operation of the image exposure device 10 will hereinafter be described. In each of the exposure heads 28 of the scanner 24, laser light beams B1 to B7 emitted from the GaN semiconductor lasers LD 1 to LD 7 (see FIG. 11) constituting the multiplex laser light source of the fiber array light source 36 are collimated by the corresponding collimator lens L1 to L7. The collimated laser light beams B1 to B7 are converged by the condenser lens 90 and are converged on the entrance end face of the core 80a of the multi-mode fiber 80.

In the preferred embodiment, the collimator lenses L1 to L7 and condenser lens 90 constitute a beam-condensing optics system. The beam-condensing optics system and multi-mode fiber 80 constitute a multiplex optics system. That is, the laser light beams B1 to B7 converged by the condenser lens 90 enter the core 80a of the multi-mode fiber 80 and propagate through that fiber 80. The multiplexed laser light beam B is emitted from the optical fiber 82 joined to the exit end face of the multi-mode fiber 80.

In each laser module 78, when the coupling efficiency of the laser light beams B1 to B7 into the multi-mode fiber 80 is 0.9 and the output of each of the GaN semiconductor lasers L1 to L7 is 50 mW, the multiplexed laser light beam B with an output of 315 mW (=50 mW×0.9×7) can be obtained for each of the optical fibers 82 arranged. Therefore, 14 (fourteen) multi-mode fibers 82 can obtain the laser light beam B with an output of 4.4 W (=0.315 W×14).

Figure 20:
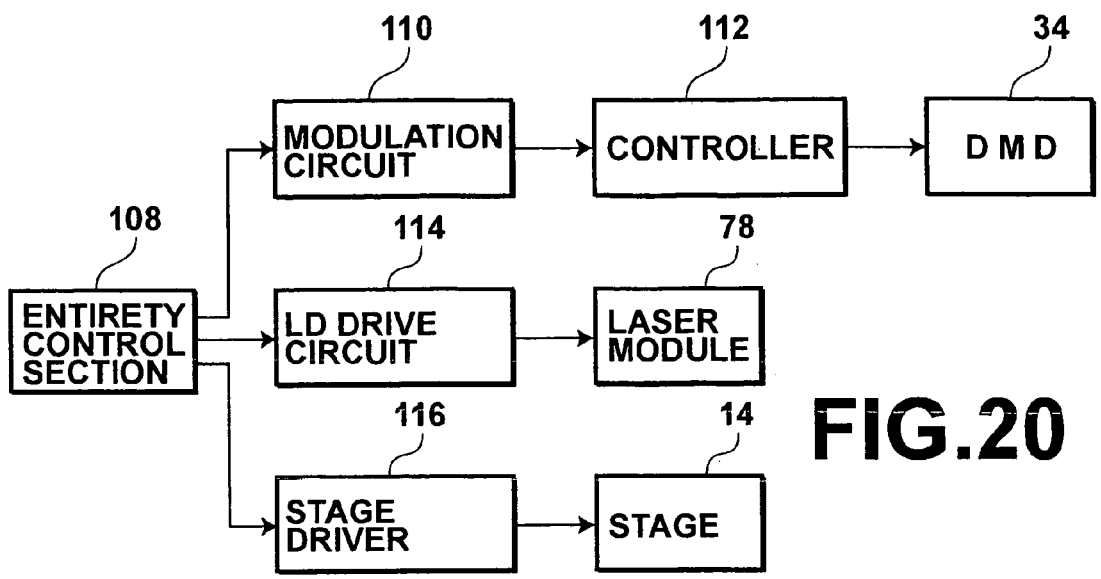
FIG. 20 is a block diagram showing the electrical construction of the image exposure device of FIG. 1.

In exposing an image, image data in dependence on an exposure pattern is input from the modulation circuit 110 shown in FIG. 20 to the controller 112 of the DMD 34 and is temporarily stored in the frame memory. The image data represents the density of each pixel constituting an image by binary data (presence or absence of a dot). According to the binary data, each micro mirror 74 of the DMD 34 is inclined at either +12° or −12°.

The movable stage 14 with the photosensitive material 12 held on the surface thereof is moved at a constant speed from the upstream side of the gate 22 to the downstream side along the guides 20 by the stage driver 116 shown in FIG. 20. If the front end of the photosensitive material 12 is detected by the sensors 26 attached to the gate 22 as the movable stage 14 passes under the gate 22, the image data stored in the frame memory is sequentially read out a plurality of lines at a time, and the data processing section generates a control signal for each exposure head 28, based on the image data read out. And by the mirror drive control section, each of the micro mirrors of the DMD 34 is turned on-and-off for each exposure head 28, based on the generated control signal.

If the laser light beam B is irradiated from the fiber array light source 36 to the DMD 34, the laser light reflected by the micro mirror 74 of the DMD 34 being in the ON state is passed through the first imaging optics system 52, first aperture array 66, micro lens array 64, second aperture array 68, second imaging optics system 58, and prism pair 70 and is imaged on the photosensitive material 12. In this manner, the laser light beam B emitted from the fiber array light source 36 is turned on-and-off, whereby the photosensitive material 12 is exposed by a number of pixels that nearly corresponds to the number of micro mirrors used in the DMD 34. Also, since the photosensitive material 12 is moved at a constant speed along with the movable stage 14, the photosensitive material 12 is scanned in the vertical scanning direction opposite to the moving direction of the movable stage 14 by the scanner 24, and consequently, a ribbon-like exposed region 30 is formed by each exposure head 28.

Figure 21A:
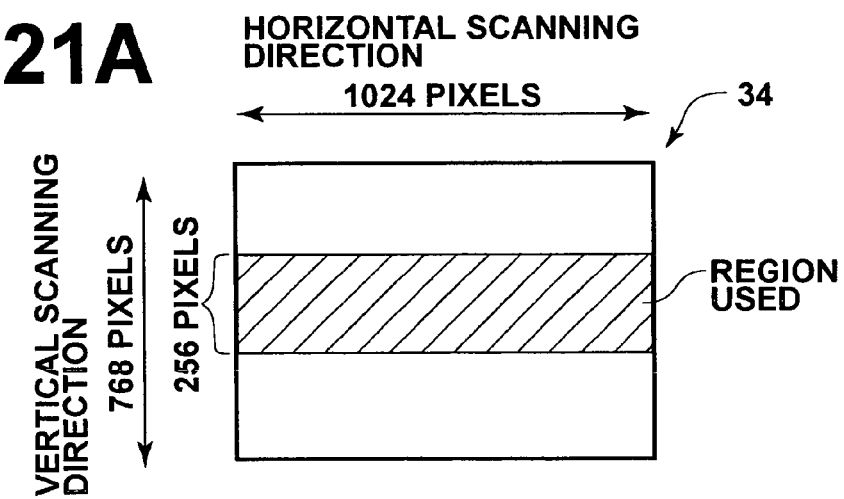
FIG. 21A is a plan view showing the case where the micro mirrors in the central portion of the DMD are used.
Figure 21B:
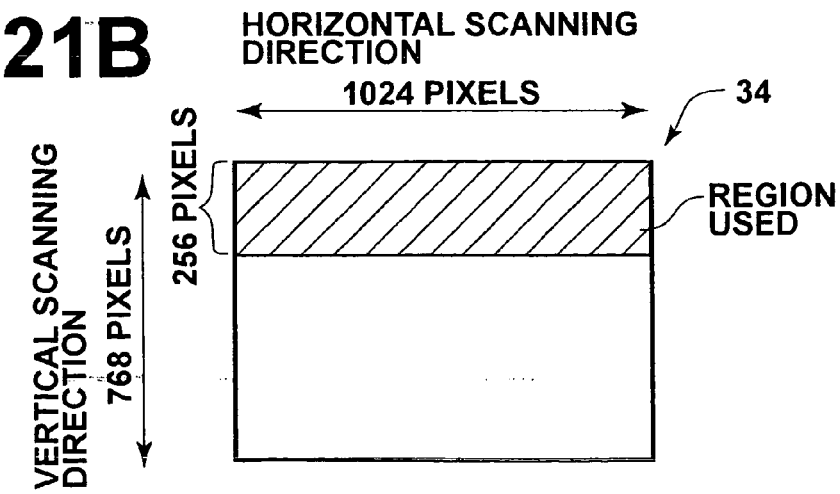
FIG. 21B is a plan view showing the case where the micro mirrors in the end portion of the DMD are used.

In the preferred embodiment, as shown in FIGS. 21A and 21B, the DMD 34 has 1024×768 micro mirrors (in which 1024 micro mirrors are arranged in the horizontal scanning direction and 768 micro mirrors are arranged in the vertical scanning direction), but only some of the micro mirrors (e.g., 1024×256 micro mirrors) are driven by the controller 112.

In the above case, as shown in FIG. 21A, the micro mirrors arranged in the central portion of the DMD 34 may be employed. Also, as shown in FIG. 21B, the micro mirrors arranged in the end portion of the DMD 34 may be employed. If some of the micro mirrors are defective, micro mirror rows containing no defective micro mirror may be used. That is, micro mirror rows that are to be used may be suitably changed according to circumstances.

There is a limit to the data processing speed of the DMD 34, and the modulation speed per line is determined in proportion to the number of micro mirrors used. Therefore, if some of the micro mirror rows are used, the modulation speed per line will be increased. On the other hand, in the case of a method of exposure in which exposure heads are successively moved with respect to an exposure surface, all the micro mirror rows in the vertical scanning direction do not need to be used.

If the vertical scanning of the photosensitive material 12 by the scanner 24 is finished, and the rear end of the photosensitive material 12 is detected by the sensors 26, the movable stage 14 is returned by the stage driver 304 to the original point that is on the most upstream side from the gate 22 along the guides 20, and the movable stage 14 is again moved at a constant speed from the upstream side to the downstream side.

While the present invention has been described with reference to the preferred embodiment thereof, the invention is not to be limited to the details given herein, but may be modified within the scope of the invention hereinafter claimed.

What is claimed is:

1. An image exposure device comprising:
    an exposure head for forming a desired pattern on a photosensitive material;
    wherein said exposure head comprises
        a light source for emitting a great number of light beams,
        a spatial light modulator in which a great number of pixel portions are arranged for independently modulating said great number of light beams emitted from said light source,
        a micro lens array in which a great number of micro lenses are arranged for individually converging said great number of light beams modulated by said great number of pixel portions, and
        a total of two or more aperture arrays arranged in at least one of a stage before said micro lens array and a stage after said micro lens array;
    and wherein each of said aperture arrays has a great number of apertures for individually restricting said great number of light beams.

2. The image exposure device as set forth in claim 1, wherein at least one of said aperture arrays is arranged in the stage before said micro lens array and at least one of said aperture arrays is arranged in the stage after said micro lens array.

3. The image exposure device as set forth in claim 1, wherein at least one of said aperture arrays is stuck on a lens surface of said micro lens; and
    wherein at least one of said aperture arrays is arranged in the stage before said micro lens.

4. The image exposure device as set forth in claim 2, wherein at least one of said aperture arrays is stuck on a lens surface of said micro lens.

5. The image exposure device as set forth in claim 1, wherein said exposure head further comprises an imaging lens for forming respective images of the pixel portions of said spatial light modulator on the lens surfaces of said micro lens array.

6. The image exposure device as set forth in claim 2, wherein said exposure head further comprises an imaging lens for forming respective images of the pixel portions of said spatial light modulator on the lens surfaces of said micro lens array.

7. The image exposure device as set forth in claim 3, wherein said exposure head further comprises an imaging lens for forming respective images of the pixel portions of said spatial light modulator on the lens surfaces of said micro lens array.

8. The image exposure device as set forth in claim 4, wherein said exposure head further comprises an imaging lens for forming respective images of the pixel portions of said spatial light modulator on the lens surfaces of said micro lens array.

9. The image exposure device as set forth in claim 1, wherein said exposure head further comprises an optical system, arranged between said spatial light modulator and one of said aperture arrays arranged closest to said spatial light modulator, for making said great number of light beams parallel.

10. The image exposure device as set forth in claim 2, wherein said exposure head further comprises an optical system, arranged between said spatial light modulator and one of said aperture arrays arranged closest to said spatial light modulator, for making said great number of light beams parallel.

11. The image exposure device as set forth in claim 3, wherein said exposure head further comprises an optical system, arranged between said spatial light modulator and one of said aperture arrays arranged closest to said spatial light modulator, for making said great number of light beams parallel.

12. The image exposure device as set forth in claim 4, wherein said exposure head further comprises an optical system, 35 arranged between said spatial light modulator and one of said aperture arrays arranged closest to said spatial light modulator, for making said great number of light beams parallel.

13. The image exposure device as set forth in claim 5, wherein said exposure head further comprises an optical system, arranged between said spatial light modulator and one of said aperture arrays arranged closest to said spatial light modulator, for making said great number of light beams parallel.

14. The image exposure device as set forth in claim 1, wherein all of said aperture arrays are arranged away from said micro lens array.

15. The image exposure device as set forth in claim 2, wherein all of said aperture arrays are arranged away from said micro lens array.

16. The image exposure device as set forth in claim 9, wherein all of said aperture arrays are arranged away from said micro lens array.

17. The image exposure device as set forth in claim 1, wherein said spatial light modulator comprises a digital micro mirror device that has a great number of micro mirrors for reflecting light emitted from said light source, as said great number of pixel portions.

18. The image exposure device as set forth in claim 2, wherein said spatial light modulator comprises a digital micro mirror device that has a great number of micro mirrors for reflecting light emitted from said light source, as said great number of pixel portions.

19. The image exposure device as set forth in claim 1, wherein said exposure head comprises a plurality of exposure heads.

20. The image exposure device as set forth in claim 2, wherein said exposure head comprises a plurality of exposure heads.

* * * * *